(12) United States Patent
Nishida et al.

(10) Patent No.: US 6,331,208 B1
(45) Date of Patent: Dec. 18, 2001

(54) PROCESS FOR PRODUCING SOLAR CELL, PROCESS FOR PRODUCING THIN-FILM SEMICONDUCTOR, PROCESS FOR SEPARATING THIN-FILM SEMICONDUCTOR, AND PROCESS FOR FORMING SEMICONDUCTOR

(75) Inventors: Shoji Nishida, Hiratsuka; Takao Yonehara, Atsugi; Kiyofumi Sakaguchi, Yokohama; Masaaki Iwane, Atsugi, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/310,954

(22) Filed: May 13, 1999

(30) Foreign Application Priority Data

| May 15, 1998 | (JP) | .................................................. | 10-133913 |
| May 15, 1998 | (JP) | .................................................. | 10-133915 |

(51) Int. Cl.$^7$ ............................. C30B 25/18; H01L 21/02
(52) U.S. Cl. ............................. 117/89; 117/915; 438/406; 438/409; 438/745; 438/773
(58) Field of Search ....................... 117/915, 89; 438/406, 438/409, 745, 773

(56) References Cited

U.S. PATENT DOCUMENTS

| 4,816,420 | | 3/1989 | Bozler et al. ............................. | 437/2 |
| 5,445,991 | * | 8/1995 | Lee .......................................... | 216/2 |
| 5,536,361 | * | 7/1996 | Kondo et al. .......................... | 117/915 |
| 5,710,057 | * | 1/1998 | Kenney ................................. | 117/915 |
| 5,966,620 | * | 10/1999 | Sakaguchi et al. .................. | 438/455 |
| 6,054,363 | * | 4/2000 | Sakaguchi et al. .................. | 438/406 |

FOREIGN PATENT DOCUMENTS

| 5-283722 | 10/1993 | (JP) . |
| 8-213645 | 8/1996 | (JP) . |
| 9-331077 | 12/1997 | (JP) . |

OTHER PUBLICATIONS

A.G. Milnes et al., "Peeled Film Technology for Solar Cells", 11$^{th}$ IEEE Photovoltaic Spec. Conf., pp. 338–341 (1975).

* cited by examiner

Primary Examiner—Robert Kunemund
(74) Attorney, Agent, or Firm—Fitzpatrick, Cella, Harper & Scinto

(57) ABSTRACT

A crystal silicon substrate is anodized to form a porous layer thereon, and a thin-film crystal is grown by epitaxial growth on the porous layer. Openings extending from the surface of the grown crystal and reaching the porous layer are provided by applying laser beams, and the porous layer is selectively etched through the openings to separate the thin-film crystal from the substrate. The thin-film crystal separated is transferred to another supporting substrate to form a solar cell. Also, porous silicon layers serving as separation layers are formed on a substrate silicon wafer on both sides, and thin-film semiconductor (thin-film single-crystal silicon) layers are formed by epitaxial growth on both porous silicon layers. Then, through openings are made in the thin-film single-crystal silicon layers. Thereafter, the porous silicon layers are removed by wet etching carried out through the openings to separate two thin-film single-crystal silicon layers simultaneously from the wafer. When solar cells are formed, the thin-film single-crystal silicon layers are used as electricity generation layers, and the openings as through holes for a contact electrode. A back electrode is further provided on each thin-film single-crystal silicon layer, and this is attached to a base conductive substrate via an insulating layer.

34 Claims, 28 Drawing Sheets

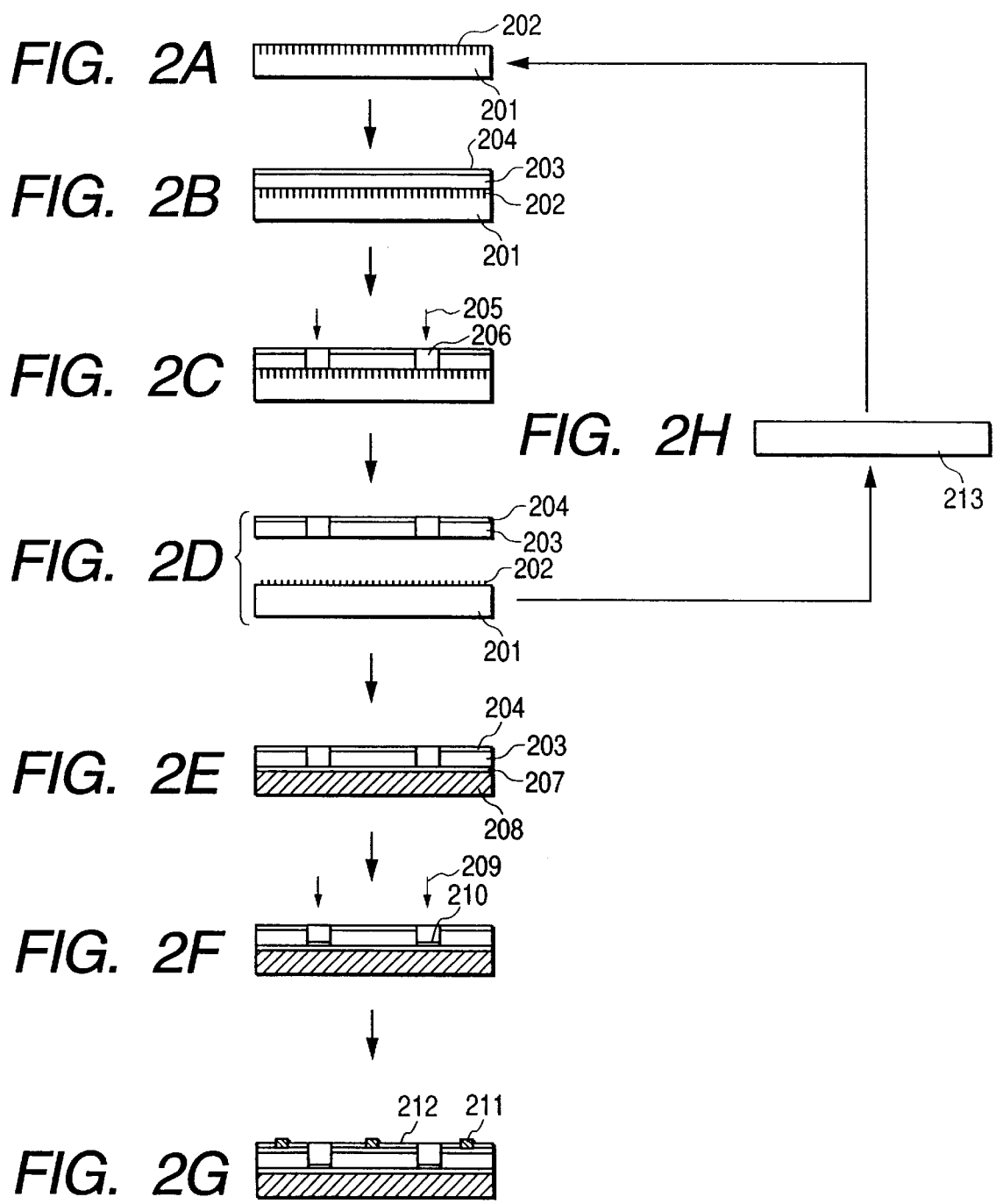

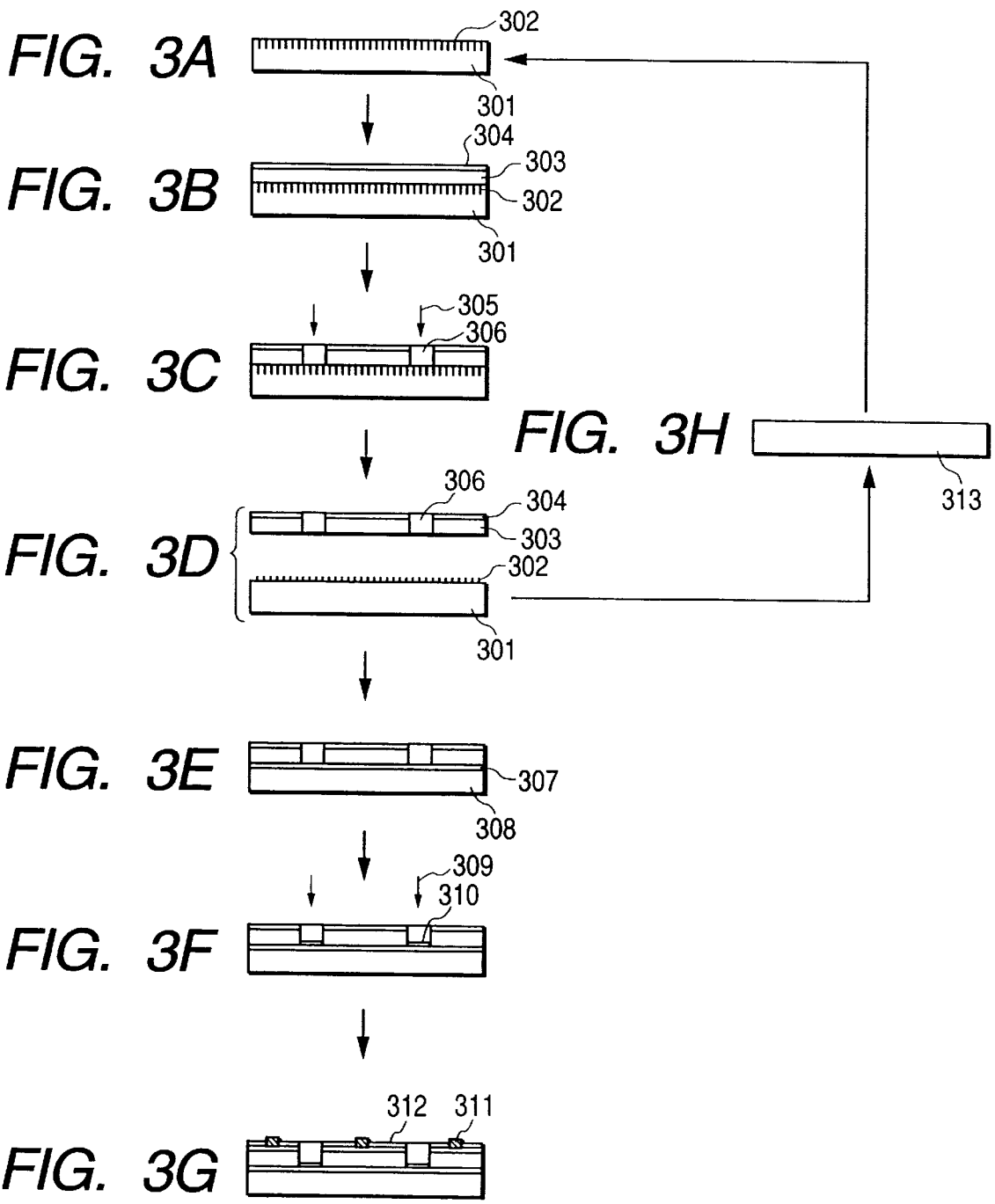

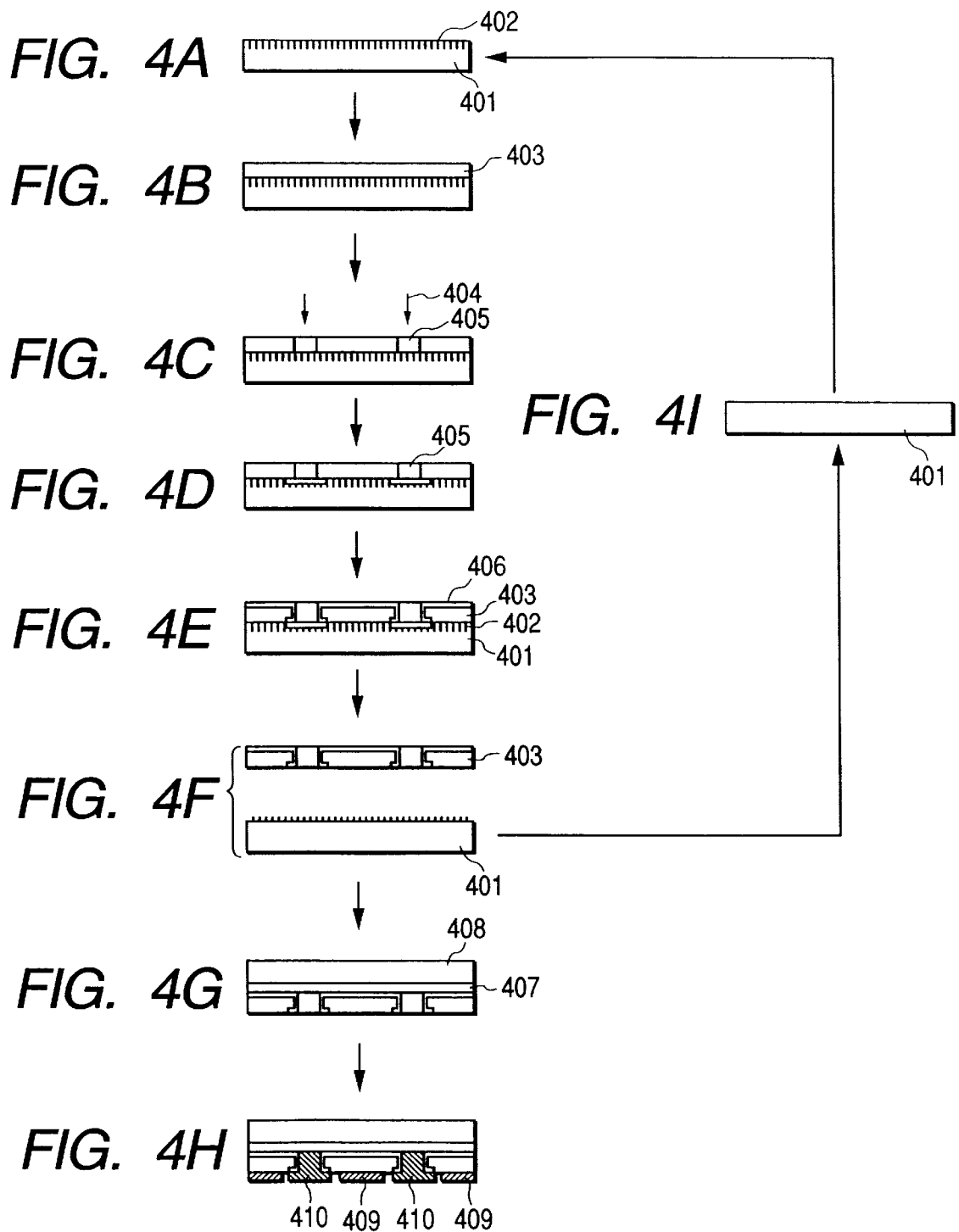

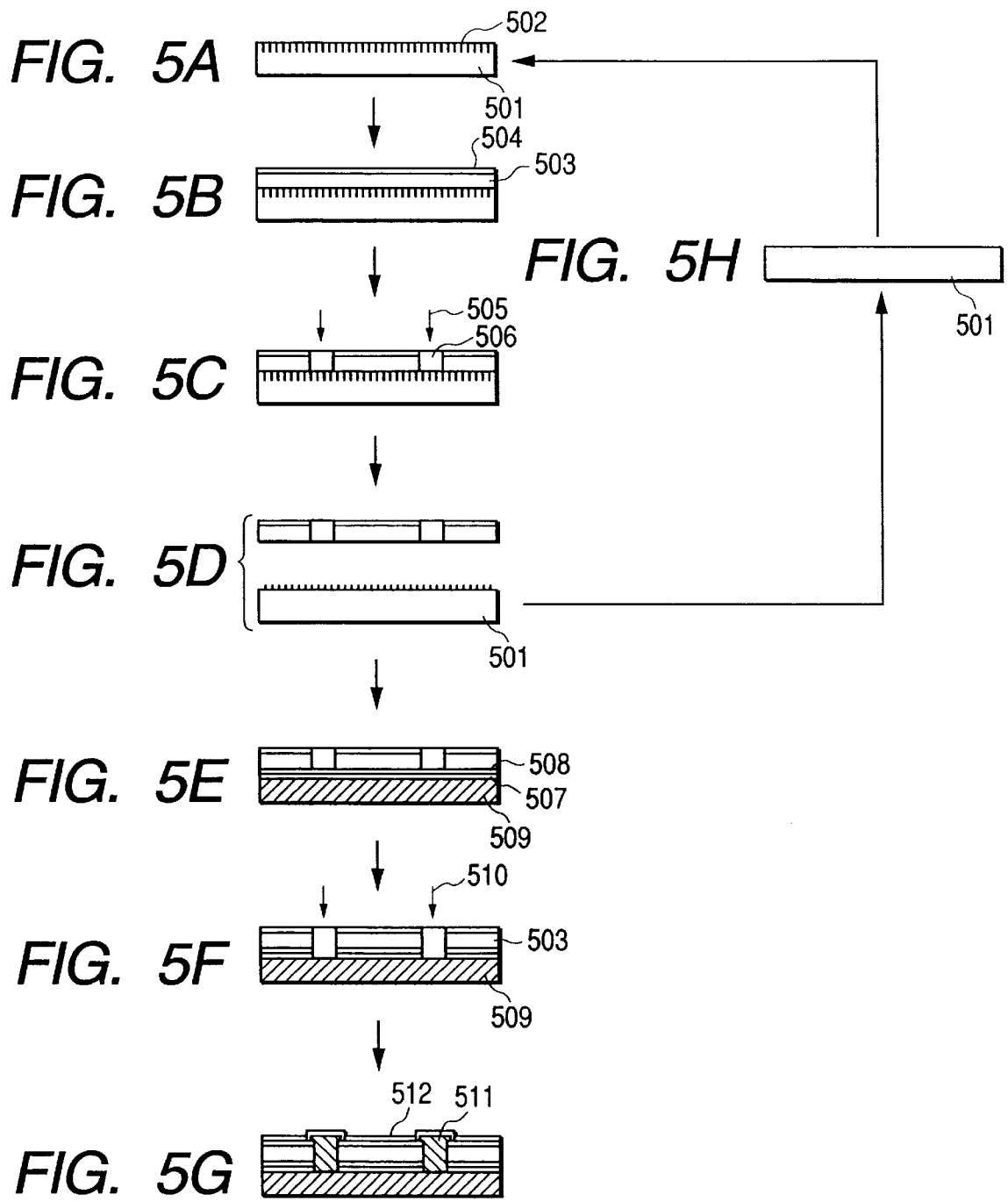

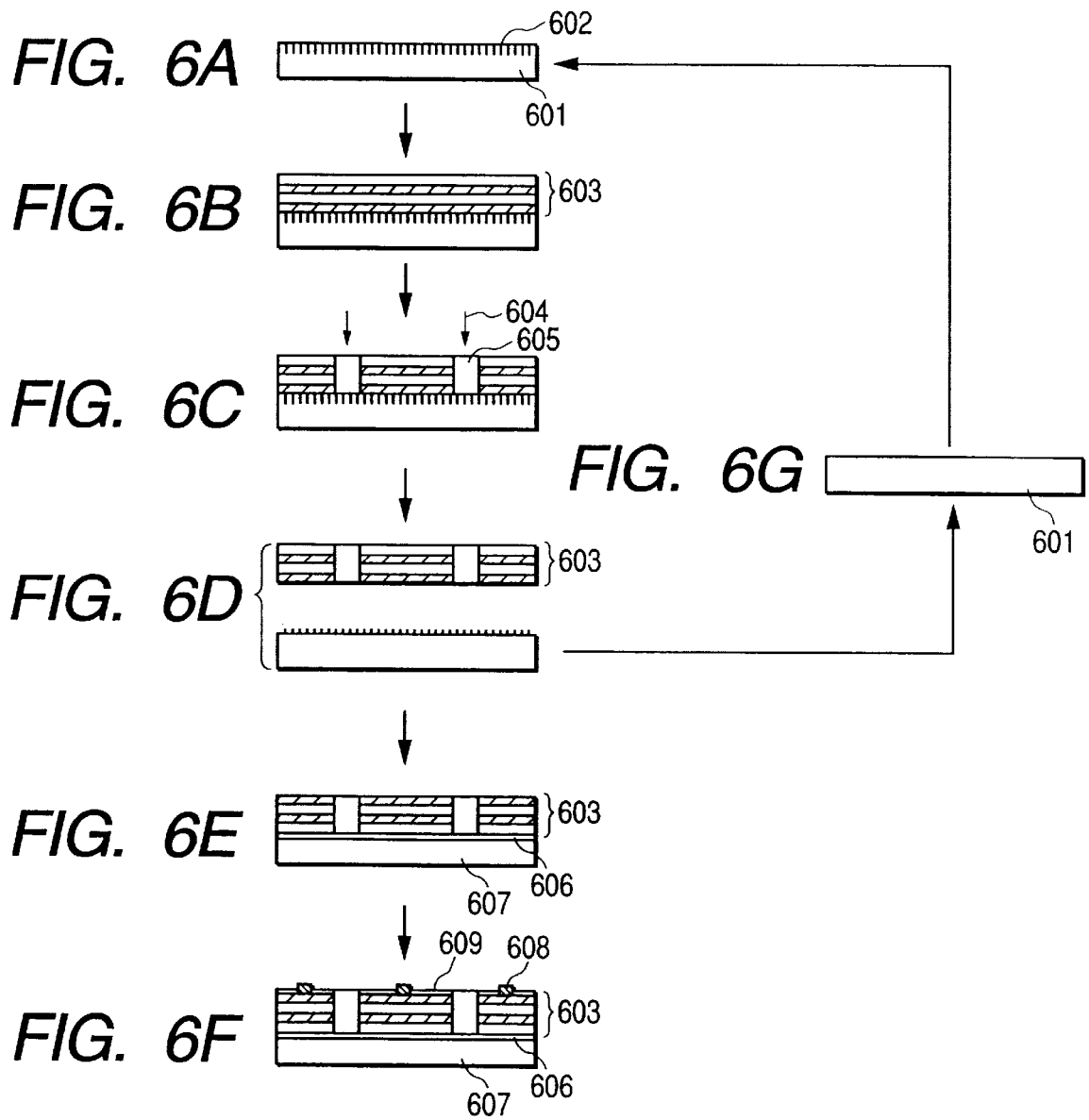

PROCESS FOR PRODUCING SOLAR CELL, PROCESS FOR PRODUCING THIN-FILM SEMICONDUCTOR, PROCESS FOR SEPARATING THIN-FILM SEMICONDUCTOR, AND PROCESS FOR FORMING SEMICONDUCTOR

BACKGROUND OF THE INVENTION

1. Field of the Invention

This invention relates to a process for separating a solar cell or a thin-film semiconductor incorporated with a thin-type circuit such as an area sensor, a process for producing such a thin-film semiconductor, a process for producing a solar cell, and a process for forming a semiconductor such as a photoelectric transducer.

2. Related Background Art

Solar cells are widely researched as clean power sources which are utilized as energy sources in various devices or which can be systematically connected to commercial electric power sources.

Because of a demand for cost advantages, solar cells are so desired that devices can be formed on low-cost substrates. Meanwhile, silicon is commonly used as the semiconductor that constitutes solar cells. In particular, from the viewpoint of the efficiency of converting light energy to an electromotive force, i.e., photoelectric conversion efficiency, single-crystal silicon excels most. However, from the viewpoint of making large-area and low-cost solar cells, amorphous silicon is considered advantageous. Also, in recent years, the use of polycrystalline silicon has been studied for the purpose of achieving a low cost comparable to amorphous silicon and a high energy conversion efficiency comparable to single-crystal silicon.

However, in processes hitherto proposed on such single-crystal silicon and polycrystalline silicon, an ingot is sliced into sheet-like substrates, and hence, it has been difficult to make them in a thickness of 0.3 mm or smaller. Thus, the substrates have had an excessive thickness for absorbing a sufficient amount of light, and hence no effective utilization of materials has been made. That is, in order to make solar cells inexpensive, they must be made more thin-gaged. Recently, a process has been proposed in which a droplet of fused silicon is cast in a mold and a silicon sheet is formed by spin processing. Its thickness, however, is about 0.1 mm to 0.2 mm, which is still not sufficiently thin, compared with the layer thickness (20 $\mu$m to 50 $\mu$m) necessary and sufficient for the absorption of light as crystalline silicon. Also such a silicon sheet does not bring about a cost reduction or provide flexibility.

Accordingly, in order to make solar cells more thin-gaged, it has been proposed that a thin-film epitaxial layer grown on a single-crystal silicon substrate is separated (peeled) from the substrate and is used in solar cells so that a high energy conversion efficiency and a cost reduction can be achieved (Milnes, A. G. and Feucht, D. L., "Peeled Film Technology Solar Cells", IEEE Photovoltaic Specialist Conference, p.338, 1975).

In the above process, however, it is necessary to insert an SiGe intermediate layer between the substrate single-crystal silicon and the grown epitaxial layer to effect heteroepitaxial growth, and it is further necessary to selectively melt this intermediate layer to peel the grown layer. In general, in the case of heteroepitaxial growth, defects tend to occur at growth interfaces because of a difference in lattice constant. Also, this process can not be said to be advantageous in process cost because materials of different types are used.

It is reported that a thin-film crystalline solar cell can be obtained by a process disclosed in U.S. Pat. No. 4,816,420, i.e., a process for producing solar cells which is characterized by forming a sheet-like crystal on a crystalline substrate by selective epitaxial growth and lateral growth via a masking material and thereafter peeling it from the substrate.

In the above process, however, an opening made in the masking material is in the form of a line. To separate from such a line seed the sheet-like crystal grown by selective epitaxial growth and lateral growth, the cleavage of crystal is utilized to peel it mechanically. Thus, a line seed having a shape larger than a certain size comes into contact with the substrate in a large area, and hence may cause a break of the sheet-like crystal in the course of peeling. Especially in the case when solar cells are made to have a large area, a line length of several mm to several cm or larger than that causes a fatal problem, however narrow the line is made (in practice, about 1 $\mu$m).

Taking account of such a point, Japanese Patent Application Laid-open No. 5-283722 discloses that a porous silicon layer is formed on the surface of a silicon wafer by anodizing, an insulating layer is deposited on the porous layer, thereafter only part of the insulating layer is left by patterning, thereafter a silicon layer is grown by selective epitaxial growth on the porous layer in its areas other than the insulating layer, and the insulating layer and porous layer are removed by etching through gaps formed on the insulating layer, to peel the silicon layer from the wafer. Thus, using this layer, a thin-film crystalline solar cell showing good characteristics can be produced.

Even the above process, however, makes it necessary to provide the step of forming the insulating layer and the step of patterning the insulating layer by photolithography, and hence still can not be said to promise a sufficiently low process cost for solar cells. Also, because of the selective epitaxial growth, silicon is not deposited on the insulating layer, and therefore an epitaxial layer having openings is formed, so that abnormal growth tends to take place around the openings to cause a leak current after the formation of a junction in some cases.

In order to materialize thin-film silicon solar cells, Mitsubishi Denki Giho (Mitsubishi Electric Technical Report, vol. 1, 69, no. 6, 1995) discloses that a thin-film polycrystalline silicon layer serving as an electricity generation layer is formed on an SiO$_2$ film on a silicon substrate, and the SiO$_2$ film is etched using through holes called via holes to remove the thin-film polycrystalline silicon. FIGS. 31A to 31F are cross-sectional views showing production steps of this process.

First, as shown in FIG. 31A, a thin-film polycrystalline silicon layer 1404 of about 100 $\mu$m thick is formed on a substrate 1401 covered with an SiO$_2$ layer 1402. Next, as shown in FIG. 31B, through holes 1406 are selectively formed by etching, and then a textured structure 1420 is formed. Thereafter, as shown in FIG. 31C, with immersion in hydrofluoric acid, part of the SiO$_2$ layer 1402 around the through holes 1406 is etched, and thereafter phosphorus is diffused to form an n-type region 1421 on the surface of the layer 1404, on the wall surfaces of the through holes 1406 and also, through the through holes, on the back side around the through holes.

Thereafter, again with immersion in hydrofluoric acid, the remaining SiO$_2$ layer 1402 is etched to separate the thin-film polycrystalline silicon layer 1404 from the substrate 1401 as shown in FIG. 31D. The substrate 1401 is returned to the initial step of forming the thin-film polycrystalline silicon layer 1404 so as to be reused. To the thin-film polycrystalline silicon layer 1404 thus separated, a glass 1423 is attached with a transparent resin 1422 as shown in FIG. 31E. Then, as shown in FIG. 31F, a p-type electrode 1424 and an n-type electrode 1425 are formed on the back side. Thus, a solar cell unit cell is completed.

In order to materialize thin-film silicon solar cells, Japanese Patent Application Laid-open No. 8-213645 also discloses that a thin-film polycrystalline silicon layer is separated by utilizing an epitaxial layer formed on a porous silicon layer. FIG. 32 is a cross-sectional view showing a production step of this process. In FIG. 32, reference numeral 1601 denotes a silicon wafer; 1602, a porous silicon layer; 1603, a p$^+$-type silicon layer; 1604, a p-type silicon layer; 1605, an n$^+$-type silicon layer; 1606, a protective layer; 1607, adhesive materials; and 1608 and 1609, jigs. In this production process, first the silicon wafer 1601 is anodized to form the porous silicon layer 1602 on the surface. Thereafter, on the porous silicon layer 1602, the p$^+$-type silicon layer 1603, the p-type silicon layer 1604, and the n$^+$-type silicon layer 1605 are formed in this order by epitaxial growth. Then, the surface is covered with the protective layer 1606, and the jigs 1608 and 1609 are bonded to both sides via the adhesive materials 1607. A tensile force is applied to the jigs 1608 to separate the p$^+$-type silicon layer 1603, the p-type silicon layer 1604 and the n$^+$-type silicon layer 1605 from the silicon wafer 1601 at the porous silicon layer 1602. Then, the publication discloses that the p$^+$-type silicon layer 1603, the p-type silicon layer 1604 and the n$^+$-type silicon layer 1605 are used as a flexible thin-film solar cell.

In solar cells, however, the production process as disclosed in Japanese Patent Application Laid-open No. 8-213645 does not always enable clean separation at the porous silicon layer 1602. Hence, cracks are often produced in the epitaxial layer, resulting in a great possibility of low yield. Also, since in this process the porous silicon layer is separated by applying a tensile force, a strong adhesion is required between the jig and the single-crystal silicon layer. Thus, the process is not suited for mass production of solar cells.

The process disclosed in the aforesaid Mitsubishi Electric Technical Report also can only produce polycrystalline-type solar cells, and hence may achieve a poor conversion efficiency compared with the case of single-crystal type solar cells.

In addition, in both the processes for producing thin-film solar cells, the processing is performed only on one side of the silicon substrate. Thus, there is room for improvement in respect of production efficiency.

SUMMARY OF THE INVENTION

An object of the present invention is to solve the problems the prior art has had and to provide a process for producing a thin-film single-crystal type solar cell with good characteristics at a low cost.

Another object of the present invention is to provide a solar cell and a thin-film semiconductor which have a high quality by the use of a single-crystal semiconductor.

Still another object of the present invention is to provide a solar cell and a thin-film semiconductor which are inexpensive because an epitaxial layer formed on a silicon wafer is transferred onto another low-cost substrate and the silicon wafer is repeatedly used.

A further object of the present invention is to provide a process for separating a thin-film semiconductor, which can be used in solar cells and any other photoelectric transducers to which the present invention is applied.

The present invention has been accomplished as a result of extensive studies made by the present inventors so that the above problems of the prior art can be solved and the above objects can be achieved.

More specifically, the process of the present invention for producing a solar cell and a thin-film semiconductor is a process for producing a solar cell making use of an epitaxial film grown on a silicon wafer, the process comprising the steps of:

i) forming a porous layer on one side surface of the silicon wafer by anodizing;

ii) growing at least one semiconductor layer on the porous layer by epitaxial growth;

iii) forming a semiconductor junction on the surface of the semiconductor layer;

iv) providing openings in the semiconductor layer, each of the openings extending from the surface of the semiconductor layer and reaching the porous layer; and v) removing the porous layer by etching through the openings to separate the semiconductor layer from the silicon wafer.

The present invention also provides a process for producing a solar cell and a thin-film semiconductor making use of an epitaxial film grown on a silicon wafer, the process comprising the steps of:

i) forming porous layers on both side surfaces of the silicon wafer by anodizing;

ii) growing semiconductor layers respectively on each of the porous layers by epitaxial growth;

iii) forming semiconductor junctions on each of the semiconductor layers;

iv) providing openings in the semiconductor layers, each of the openings extending from the surfaces of the semiconductor layers and reaching the porous layers; and v) removing the porous layers by etching through the openings to separate the semiconductor layers from the silicon wafer.

The present invention also provides a process for separating a thin-film semiconductor, and a process for producing a solar cell by using this separation process, the separation process comprising forming a separation layer on a substrate, forming a thin-film semiconductor on the separation layer, forming in the thin-film semiconductor through openings which reach the separation layer, and separating the thin-film semiconductor from the substrate at the separation layer, wherein the separation layer is formed in a pair on both sides of the substrate, the thin-film semiconductor is formed in a pair on both separation layers, the through openings are formed in both thin-film semiconductors so as to reach both separation layers, and both thin-film semiconductors are separated from the substrate at both separation layers.

The present invention still also provides a process for producing a semiconductor, which comprises forming a porous silicon layer on a substrate, forming a thin-film semiconductor on the porous silicon layer, forming through openings in the thin-film semiconductor which reach the porous silicon layer, and separating the thin-film semiconductor from the substrate at the porous silicon layer to form the semiconductor, wherein the porous silicon layer is formed on both sides of the substrate, the thin-film semiconductor is formed on porous silicon layers, a p-n junction is formed on both thin-film semiconductors, the through openings are formed in both thin-film semiconductors so as to extend from the surfaces of both thin-film semiconductors, and reach both porous silicon layers, both thin-film semiconductors are separated from the substrate at both porous silicon layers, and electrodes are formed on each of the surfaces of the p-n junctions.

BRIEF DESCRIPTION OF THE DRAWINGS

FIGS. 2A, 2B, 2C, 2D, 2E, 2F, 2G and 2H are a flow sheet illustrating a solar cell production process according to a first principal technique of the present invention.

FIGS. 3A, 3B, 3C, 3D, 3E, 3F, 3G and 3H are a flow sheet illustrating another solar cell production process according to the first principal technique of the present invention.

FIGS. 4A, 4B, 4C, 4D, 4E, 4F, 4G, 4H and 4I are a flow sheet illustrating still another solar cell production process according to the first principal technique of the present invention.

FIGS. 5A, 5B, 5C, 5D, 5E, 5F, 5G and 5H are a flow sheet illustrating still another solar cell production process according to the first principal technique of the present invention.

FIGS. 6A, 6B, 6C, 6D, 6E, 6F and 6G are a flow sheet illustrating a further solar cell production process according to the first principal technique of the present invention.

DESCRIPTION OF THE PREFERRED EMBODIMENTS

Figure 1A:
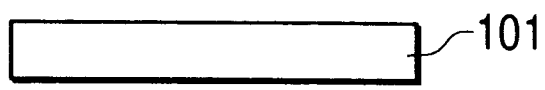
FIGS. 1A, 1B, 1C, 1D and 1E are schematic cross-sections showing the structure of a solar cell obtained by the solar cell production process of the present invention.
Figure 1B:
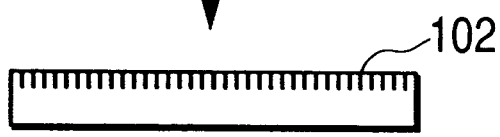
Figure 1C:
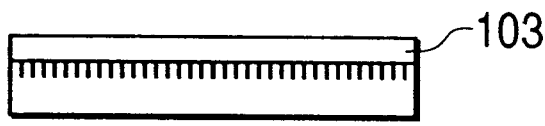
Figure 1D:
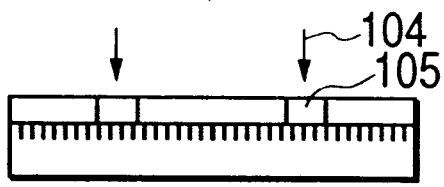
Figure 1E:
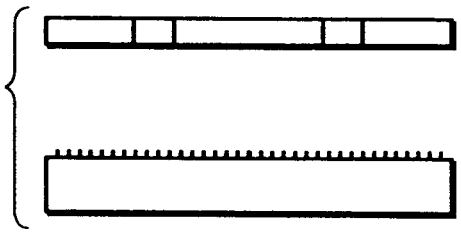

The first principal technique of the present invention is, as shown in FIGS. 1A to 1E, to make the surface of a silicon wafer (crystalline silicon substrate) 101 (FIG. 1A) porous by anodizing in a hydrofluoric acid solution to form a porous layer 102 thereon (FIG. 1B), form superposingly thereon a semiconductor layer (active layer) 103 by epitaxial growth (FIG. 1C), providing openings 105 partly in the semiconductor layer 103 which extend to reach the porous layer 102, by a means such as laser beams 104 (FIG. 1D), and remove the porous layer 102 by selective etching through the openings 105 to form a single-crystal semiconductor thin film.

In the prior art solar cell production process shown in Japanese Patent Application Laid-open No. 5-283722 mentioned previously, disclosed is a process comprising the steps of:

i) forming a porous silicon layer on a silicon wafer on one side surface by anodizing;

ii) forming an insulating layer on the porous layer, and leaving only part of the insulating layer by patterning to produce a substrate;

iii) growing a silicon layer by selective epitaxial growth on the porous layer in its areas other than the insulating layer;

iv) forming a semiconductor junction on the surface of the silicon layer; and v) removing the insulating layer and porous layer by etching through gaps formed on the insulating layer, to separate the silicon layer from the substrate.

Compared with the above prior art, the present invention is improved in the following points.

(1) When the openings are provided in the semiconductor layer such as a silicon layer, it is unnecessary to form the pattern of an insulating layer previously by using a process such as photolithography before the semiconductor layer is grown.

(2) Since the epitaxial growth is made on the whole substrate surface, any abnormal growth by no means takes place around the openings as in the case of selective epitaxial growth. Hence, any leak current which may be caused by such abnormal growth does not occur after the formation of a semiconductor junction on the surface of the semiconductor layer.

The present inventors made experiments repeatedly to have discovered that the openings which extend from the surface of a semiconductor layer to reach a porous layer can be formed using a laser, and only the porous (silicon) layer can selectively be etched through the openings with an etchant (etching solution) having no etching action on semiconductor crystals. As a result, they have reached a finding that good thin-film single-crystal semiconductor layers can be transferred to low-cost substrates such as metal substrates. Thus, they have accomplished the present invention.

Embodiment 1

In the present embodiment, openings are provided in a silicon layer by means of a laser to obtain a thin-film single-crystal silicon solar cell. This will be described in detail with reference to FIGS. 2A to 2H.

First, a substrate 201 is prepared which is a p$^+$-type single-crystal silicon substrate or a single-crystal silicon substrate to a surface layer of which B (boron) has been introduced by thermal diffusion to form a p$^+$-type surface layer. This single-crystal substrate, at least the surface layer of which has been turned into p$^+$-type, is made porous by anodizing in a hydrofluoric acid solution, to form a surface porous layer 202 (FIG. 2A).

Next, on the surface porous layer 202, a silicon layer 203 having a thickness necessary and sufficient to be an active layer of a solar cell is formed by an epitaxial growth process such as liquid phase growth or thermal CVD (chemical vapor deposition) (FIG. 2B). Here, at the time the silicon layer 203 is formed, a dopant may be mixed in a very small quantity so that the silicon layer 203 can be controlled to be p$^-$-type.

If necessary, on the silicon layer 203, an n$^+$-type (or p$^+$-type) layer 204 may be deposited by plasma-assisted CVD or may be formed by changing the type and quantity of the dopant at the time the formation of the above silicon layer 203 is finished. Thus, the p-n junction is formed on the surface of the silicon layer 203.

Next, the surface of the silicon layer 203 is irradiated by laser beams 205 previously adjusted to a diameter of several hundred μm using an XeCl or the like excimer laser. Thus, openings 206 are provided (FIG. 2C). The substrate 201 is immersed in a selective etchant to remove the porous layer 202 through the openings 206, and then the silicon layer 203 is separated from the substrate 201 (FIG. 2D).

The silicon layer 203 thus separated is transferred onto another supporting substrate 208 having a silicide layer 207 which functions as an adhesive layer (FIG. 2E). When any semiconductor junction is not formed in the course of the foregoing (see FIG. 2B), the junction may be formed at this stage. Thereafter, the laser beams 209 are applied to form an insulating layer 210 in each opening 206 (FIG. 2F), and a collector electrode 211 and a surface anti-reflective layer 212 are successively formed to make up a solar cell (FIG. 2G). The substrate 201 having been separated is made into a regenerated single-crystal substrate 213 by removing the porous layer 202 remaining on its surface (FIG. 2H) and is again put into the step shown as FIG. 2A.

As described above, the present invention is concerned with a process for producing a thin-film crystal solar cell which process comprises forming the porous layer 202 on the silicon substrate 201, and peeling from the silicon substrate the epitaxial layer grown on the porous layer 202 and transferring it onto a low-cost substrate, supporting substrate 208.

Characteristic features of the present invention are that the same properties as those of an epitaxial layer formed on a wafer can be attained by utilizing the epitaxial layer formed on the porous layer, and that the process is cost-advantageous because low-cost substrates such as metal substrates can be used and also the silicon substrate on which the porous layer is formed can be reused (repeatedly used). Also, solar cells having a higher conversion efficiency can be obtained because a compound semiconductor layer can be formed on the porous layer.

In the anodizing used in the present invention for the formation of the porous silicon layer, a hydrofluoric acid solution may preferably be used, and the silicon layer can be made porous at a hydrofluoric acid concentration of 10% or more. The amount of electric currents flowed at the time of anodizing may appropriately be determined depending on the hydrofluoric acid concentration, the layer thickness desired for the porous layer, the surface state of the porous layer and so forth. Stated approximately, it may suitably be in the range of from several mA/cm$^2$ to several tens of mA/cm$^2$.

An alcohol such as ethyl alcohol may be added to the hydrofluoric acid solution, whereby any bubbles of a reaction gas generated at the time of anodizing can be removed from the reacting surface instantaneously and without stirring. Thus, the porous silicon layer can be formed uniformly and with good efficiency. The amount of the alcohol to be added may appropriately be determined depending on the hydrofluoric acid concentration, the layer thickness desired for the porous layer, the surface state of the porous layer and so forth. Especially, it must be determined so as not to result in too low a hydrofluoric acid concentration.

In the present invention, the epitaxial growth process used to form the silicon layer on the porous layer includes thermal CVD, LPCVD (low-pressure CVD), sputtering, plasma-assisted CVD, photo-assisted CVD and liquid-phase growth. For example, in the case of thermal CVD, LPCVD, plasma-assisted CVD or photo-assisted CVD, material gases used therefor may typically include silanes or halogenated silanes such as $SiH_2Cl_2$, $SiCl_4$, $SiHCl_3$, $SiH_4$, $Si_2H_6$, $SiH_2F_2$ and $Si_2F_6$.

Hydrogen ($H_2$) is added as a carrier gas or in addition to the above material gas for the purpose of providing a reducing atmosphere. The proportion of quantities of the material gas and hydrogen may appropriately be determined depending on the manner of formation, the type of material gas, the conditions of formation and so forth. It may suitably be from 1:10 to 1:1,000 or less (feed flow rate ratio), and preferably from 1:20 to 1:800.

In the case when liquid-phase growth is used, silicon is dissolved in a solvent such as Ga, In, Sb, Bi and Sn in an atmosphere of $H_2$ or $N_2$, and the solvent is cooled slowly or a temperature difference is made in the solvent to carry out epitaxial growth.

In the case when the compound semiconductor layer is formed on the porous layer, MOCVD (metalorganic CVD), MBE (molecular beam epitaxy) or liquid-phase growth is used. Materials used in these crystal growth processes are appropriately determined depending on the type of the compound semiconductor to be formed and the respective growth processes. For example, in the case when GaAs is formed, $Ga(CH_3)_3$, $AsH_3$ or $Al(CH_3)_3$ is used in MOCVD, or, in the liquid-phase growth, Ga is used as a solvent, and As or As and Al is/are dissolved to effect growth.

The temperature and pressure in the epitaxial growth process used in the present invention may differ depending on the formation process, the type of materials (gases) used and so forth. With regard to the temperature, when, e.g., silicon is grown by typical thermal CVD, approximately a temperature of from 800° C. to 1,250° C. is suitable, and may more preferably be controlled from 850° C. to 1,200° C. In the case of liquid-phase growth, when Sn or In is used as the solvent, the temperature may preferably be controlled from 600° C. to 1,050° C., depending on the type of the solvent. When GaAs is grown using Ga as the solvent, it may preferably be controlled from 650° C. to 850° C. In the case when GaAs is grown by MOCVD, it may preferably be controlled from 650° C. to 900° C. In the case of low-temperature processes such as plasma-assisted CVD, it is suitable for the temperature to be controlled approximately from 200° C. to 600° C., and more preferably from 200° C. to 500° C.

Similarly, with regard to the pressure, it may suitably be approximately in the range of from $10^{-2}$ Torr to 760 Torr, and more preferably from $10^{-1}$ Torr to 760 Torr. When MBE is used, the pressure may suitably be $10^{-5}$ Torr or below, and more preferably be $10^{-6}$ Torr or below.

In the present invention, laser beams may preferably be used as a means for providing the openings in the silicon layer 203. As lasers therefor, $CO_2$ gas lasers, argon lasers, YAG lasers, ruby lasers or excimer lasers may readily be used. In particular, XeCl or KrF excimer lasers and YAG lasers are most preferred. Conditions for the irradiation by laser beams when the openings are provided are appropriately determined depending on the type of the lasers, the layer thickness of the silicon layer and also the diameter of the openings. For example, when pulse oscillation is utilized, the laser beams may preferably have a frequency of from 1 Hz to 100 kHz, and the laser may have an average output ranging from 10 mW to 1 kW.

The present invention can be more effective as stated below, when the laser beams are used in the formation of openings (holes) through which an etchant is made to soak into the silicon layer.

That is, the silicon layer on which semiconductor junction has been formed (i.e., which has semiconductor junction) may be irradiated by laser beams under the conditions described above, whereby the openings can be formed in such a state that the structure around the openings has been made to be damaged as little as possible; thus, any disorder of the p-n junction interface laid bare to the wall surfaces of the openings can be restrained. As a result, any defects caused by making the openings can be prevented, any surface levels at the p-n junction interface can be prevented from being formed, and any leak or short can be prevented from being caused by recombination, so that the solar cell characteristics can be improved. Also, because of a superior productivity, the cost can be reduced. Moreover, the laser processing may be carried out in an $O_2$ atmosphere or an $N_2$ atmosphere. Thus, a film with insulating properties, such as an oxide film or a nitride film, can be formed simultaneously with the formation of openings on the wall surfaces of the openings. Processing in this way makes it possible to more effectively prevent any leak or short from occurring at the p-n junction interface.

When such an oxide film or a nitride film is formed in this way, an etchant or conditions of the type that does not dissolve the oxide film or nitride film may be selected in the subsequent etching step so that the oxide film or nitride film can be effectively maintained after separation. For example, an etchant of an alkaline type such as KOH, NaOH or TMA (tetramethyl ammonium) may preferably be used in the case when the oxide film is formed. In the case of the nitride film, it is possible to use, as well as the alkali type etchant, an acidic etchant having a low concentration or to carry out acidic etching for a short time, because of its superior acid resistance to that of the oxide film. The formation of such a film may be carried out as an additional step.

Size and distance of the openings are appropriately determined depending on the type of the etchant, the etching rate, the opening percentage of the light incident surface when a solar cell is made up, and the sheet resistance of the silicon surface layer when through-hole contacts are formed. Stated approximately, the openings may each have a diameter of from 10 μm to 500 μm. There are no particular prescriptions on the manner of arrangement of the openings. When arranged in lattice dots, the openings may suitably be at intervals ranging approximately from 50 μm to 5 mm.

As the etchant for the porous silicon, at least one of a conventional silicon etchant, hydrofluoric acid which is a selective etchant for porous silicon, a mixture solution prepared by adding at least any one of alcohol and hydrogen peroxide water to hydrofluoric acid, buffered hydrofluoric acid or a mixture solution prepared by adding at least any one of alcohol and hydrogen peroxide water to buffered hydrofluoric acid, and an aqueous solution of an alkali such as KOH, NaOH or TMA is suitable.

In the solar cell of the present invention, as materials of the substrate to which the thin-film crystal semiconductor layer is transferred, metal substrates may preferably be used, typically including SUS stainless steel. Glass and plastic sheets or resin films may also be used.

In the solar cell of the present invention, the surface of the semiconductor layer may be subjected to texture treatment so that the reflection loss of incident light can be lowered. In the case of silicon, the treatment is made using hydrazine, NaOH or KOH. Pyramids of the texture formed may suitably be in a height ranging from several μm to tens of μm.

The second principal technique of the present invention is a process for separating a thin-film semiconductor, the process comprising forming a separation layer on a substrate, forming a thin-film semiconductor on the separation layer, forming through openings in the thin-film semiconductor which reach the separation layer, and separating the thin-film semiconductor from the substrate at the separation layer, wherein the separation layer is formed in a pair on both sides of the substrate, the thin-film semiconductor is formed in a pair on both separation layers, the through openings are so formed in both thin-film semiconductors as to reach both separation layers, and both thin-film semiconductors are separated from the substrate at both separation layers.

According to the second principal technique of the present invention, two sheets of thin-film semiconductors can be separated in one cycle of production steps. Hence, the production cost can be made low.

In the present invention, the etchant may preferably be made to enter through the through openings so that the separation layer can be selectively etched to separate the thin-film semiconductor from the substrate. Thus, e.g., the problem of breaking of the thin-film semiconductor can be made less likely to occur because mechanical separation is unnecessary.

In the present invention, the separation layer may also preferably be a porous silicon layer 202, and the thin-film semiconductor may preferably be a single-crystal silicon layer formed on the porous silicon layer by epitaxial growth. Thus, the thin-film semiconductor can have a greater mobility than amorphous or polycrystalline ones, and, when a solar cell is made, it can have a higher photoelectric conversion efficiency.

In the present invention, when the epitaxial growth is carried out, the substrate may preferably be supported at four points so that the surface and back of the substrate can be kept open. Thus, even when a circular substrate is cut into a quadrangle readily usable in solar cells or area sensors, the points at which the substrate is supported are cut off, and hence the process can make good use of a step.

The present invention also embraces a process for producing a solar cell. In such a case, the thin-film semiconductor serves as an electricity generation layer, and the through openings serve as through holes. With such a constitution, the through openings used in separation can be used as conduction openings of contact electrodes. Thus, production efficiency can be improved.

Not limited to the solar cell, the present invention also embraces a process for forming a thin-film semiconductor itself. For example, in the second principal technique of the present invention, thin-film semiconductors are formed on a substrate on both sides via porous silicon layers, and thereafter an etchant is soaked through the through openings to remove the porous silicon layers so that the thin-film semiconductors can be used as photoelectric transducers.

Embodiments of the second principal technique of the present invention will be described below in detail with reference to the drawings.

FIGS. 8A to 8D are cross-sectional views showing a production process of the present invention. In the drawings, reference numeral 1001 denotes a substrate; 1002 and 1003, separation layers; 1004 and 1005, thin-film semiconductors; 1006 and 1007, through openings; 1008, a back electrode; 1009; a contact electrode; 1010, a base conductive substrate; and 1011, an insulating layer.

Figure 8A:
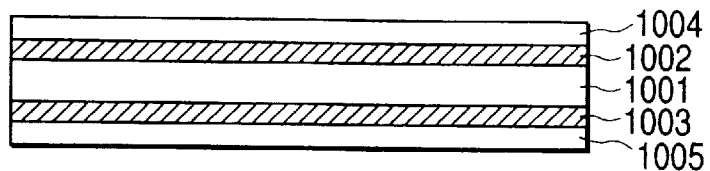
FIGS. 8A, 8B, 8C and 8D are schematic cross-sections showing a process of separating a thin-film semiconductor, which is a second principal technique of the present invention.
Figure 8B:
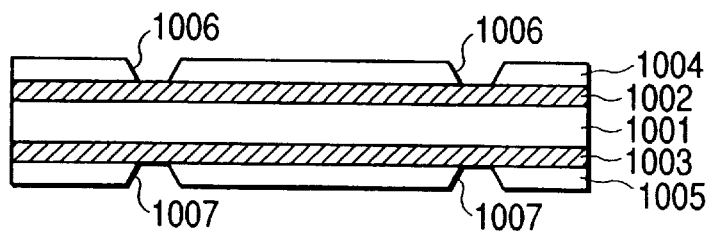
Figure 8C:
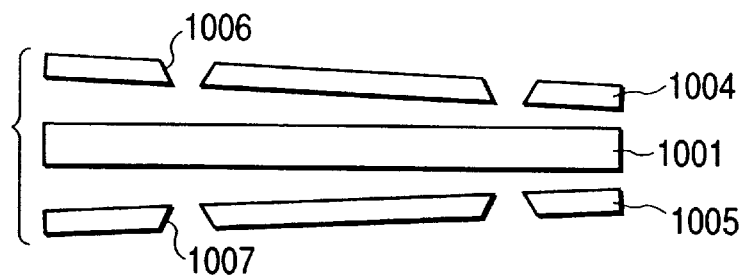
Figure 8D:
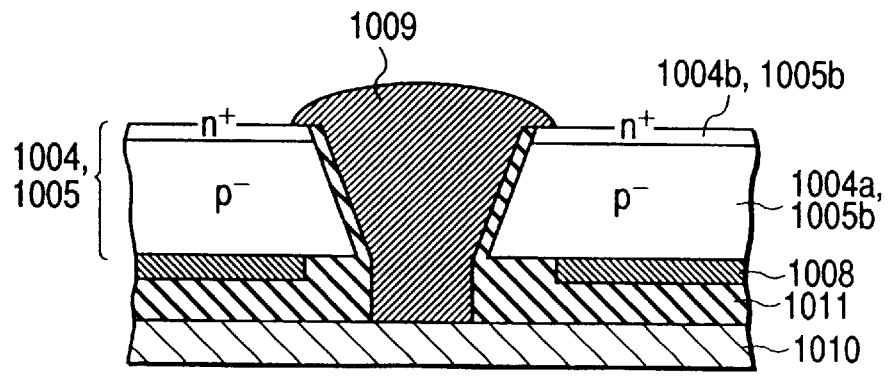

As shown in FIGS. 8A to 8D, separation layers 1002 and 1003 are provided on the substrate 1001 on both sides, and the thin-film semiconductors 1004 and 1005 are formed on both separation layers 1002 and 1003, respectively (FIG. 8A). Then, through openings 1006 and 1007 are made in the thin-film semiconductors 1004 and 1005, respectively (FIG. 8B). Thereafter, the thin-film semiconductors 1004 and 1005 are separated from the substrate 1001 at the separation layers 1002 and 1003 through the through openings 1006 and 1007, respectively (FIG. 8C). Then, when a solar cell is produced, the thin-film semiconductors 1004 and 1005 serve as electricity generation layers. The through openings 1006 and 1007 can be utilized as through holes which connect the contact electrode 1009 with the base conductive substrate 1010. The back electrode 1008 acts as an output electrode and a light-reflecting layer. The insulating layer 1011 insulates the base conductive substrate 1010 from the back electrode 1008 (FIG. 8D).

The present invention will be described below by Embodiments 2 to 6. To summarize each embodiment, Embodiment 2 is an embodiment for producing a solar cell, in which the thin-film semiconductors 1004 and 1005 serving as electricity generation layers are formed by epitaxial growth on the separation layers 1002 and 1003 serving as porous semiconductor layers, and the separation layers 1002 and 1003 are selectively etched from both sides through the through openings 1006 and 1007 to separate the thin-film semiconductors 1004 and 1005 from the substrate 1001. Embodiment 3 is substantially the same as Embodiment 2, but is an embodiment in which, when the thin-film semiconductors 1004 and 1005 are separated from the substrate 1001, a pressing member is pressed against the separation layer 1002 or 1003 or the substrate 1001 through the through openings 1006 or 1007. Embodiment 4 is also substantially the same as Embodiment 2, but insulating layers are used to form the through openings 1006 and 1007. Embodiment 5 is also an embodiment for producing a solar cell, but is an embodiment in which silicon oxide is used in the separation layers 1002 and 1003 and the separation layers 1002 and 1003 are selectively etched from both sides through the through openings 1006 and 1007 to separate the thin-film semiconductors 1004 and 1005 from the substrate 1001. Embodiment 6 is an embodiment for producing a photoelectric transducer such as an area sensor. The present invention is by no means limited to these embodiments and may embrace embodiments formed by combination of any of these Embodiments.

Embodiment 2

Embodiment 2 is an embodiment for producing a solar cell. In the present embodiment, the substrate 1001 is anodized to form the porous semiconductor layers, separation layers 1002 and 1003, on the substrate 1001. Thereafter, the electricity generation layers, thin-film semiconductors 1004 and 1005, are formed by epitaxial growth (epitaxial semiconductor layers) on the separation layers 1002 and 1003, and the separation layers 1002 and 1003 are selectively etched from both sides through the through openings 1006 and 1007 to separate the thin-film semiconductors 1004 and 1005 from the substrate 1001. In the present embodiment, the substrate 1001 is described as a silicon wafer. Alternatively, a metallurgical-grade silicon substrate or a compound semiconductor substrate of GaAs may also be used as the substrate 1001. The separation layers 1002 and 1003 are also described as porous silicon layers, and the thin-film semiconductors 1004 and 1005 as single-crystal epitaxial silicon layers. Alternatively, the separation layers 1002 and 1003 may be noted as common porous silicon layers, and the thin-film semiconductors 1004 and 1005 as common semiconductor layers inclusive of polycrystalline ones. In view of readiness for separation, porous semiconductors are preferred. Also, in view of making semiconductors have fewer defects and preventing impurities from mixing, the separation layers may preferably be made of the same material as the substrate and/or the thin-film semiconductors.

Figure 9:
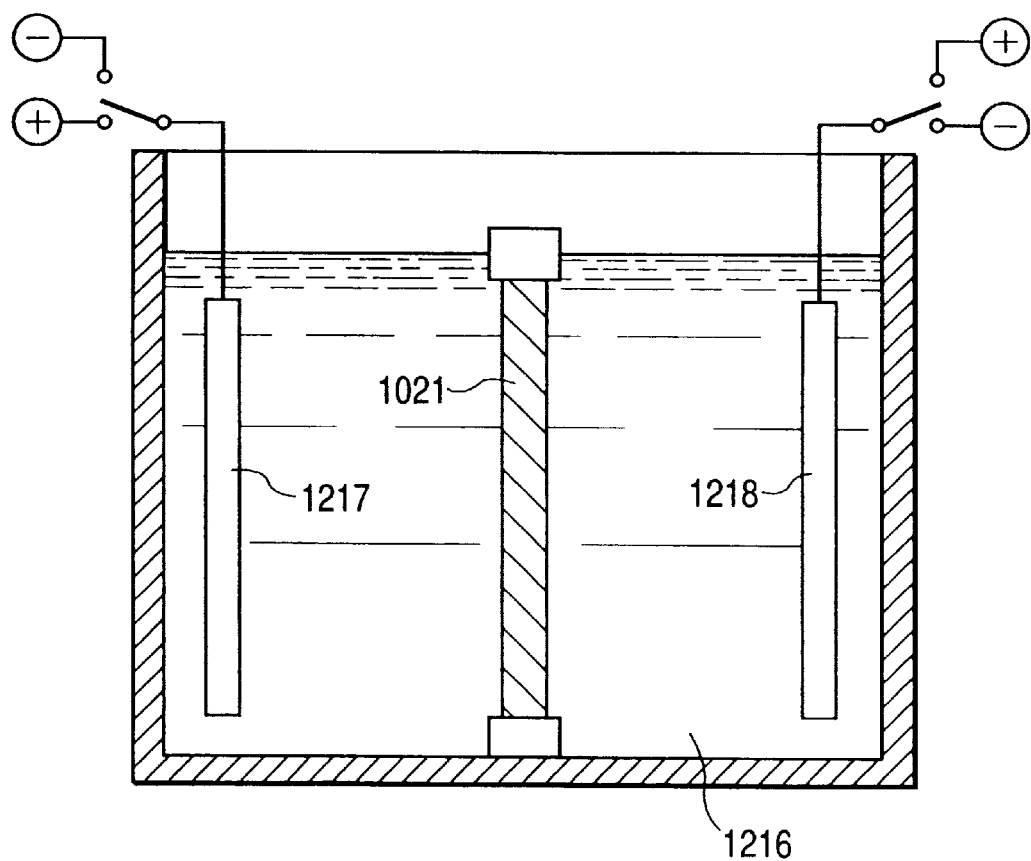
FIG. 9 is a schematic cross-section of an anodizing apparatus used in Embodiment 2 of the present invention.

FIG. 9 is a cross-sectional view of an apparatus for anodizing a silicon wafer with a hydrofluoric acid type etchant. In FIG. 9, reference numeral 1021 denotes the silicon wafer; 1216, the hydrofluoric acid type etchant; 1217 and 1218, metal electrodes. The silicon wafer 1021 to be anodized may preferably be of p-type or may be of n-type so long as it has a low resistance. Also, even such an n-type wafer can be made porous so long as it is irradiated by light and brought into the state the holes are formed. Since the silicon wafer 1021 is anodized on both sides, it is preferable to use a silicon wafer 1021 mirror-finished on both sides. In the case when the p-type silicon wafer 1021 is used, it may preferably be a (100) or (111) substrate and have a resistivity of from 0.1 to 0.001 Ω·cm, and more preferably from 0.05 to 0.001 Ω·cm.

As shown in FIG. 9, setting the left-side metal electrode 1217 as the positive and the right-side metal electrode 1218 as the negative, a voltage is applied across both electrodes, and the electric field caused by this voltage is so set as to be applied in the direction vertical to the surface of the silicon wafer 1021. Thus, the silicon wafer 1021 is made porous first on the side of the negative metal electrode 1218. A concentrated hydrofluoric acid solution (49% hydrofluoric acid) is used as the hydrofluoric acid type etchant 1216. During the anodizing, air bubbles occur from the silicon wafer 1021, and hence an alcohol may preferably be added as a surfactant so that the air bubbles can be removed with good efficiency. As the alcohol, preferred are methanol, ethanol, propanol and isopropanol. In place of the surface-active agent, a stirrer may be used to carry out the anodizing with stirring. The surface may be made porous in a depth of from 1 to 30 $\mu$m.

Next, the positive and negative of the metal electrodes 1217 and 1218 are replaced with each other to carry out anodizing. Namely, setting the metal electrode 1217 as the negative and the metal electrode 1218 as the positive, the anodizing is carried out; thus, the surface of the silicon wafer 1021 is made porous on the side of the metal electrode 1217. As the result, both surfaces of the silicon wafer 1021 can be made into porous surfaces. In the metal electrodes 1217 and 1218, materials not attacked by the hydrofluoric acid solution may preferably be used, as exemplified by gold (Au) and platinum (Pt). The anodizing may be carried out at a current density of hundreds of mA/cm$^2$ at maximum and not 0 at minimum.

In the anodizing step, the current density may preferably vary with the time. As for porous silicon, the porous silicon layer comes to have a small density when the current density is high at the time of anodizing. Hence, the volume of holes increases with an increase in current density, and the porosity increases (the porosity is defined by the proportion of density of porous silicon to density of bulk silicon). The porous silicon layer has many holes in the silicon layer, but its single-crystal state is maintained. Hence, it is possible to form the single-crystal silicon layer on the porous silicon layer by epitaxial growth.

Figure 10:
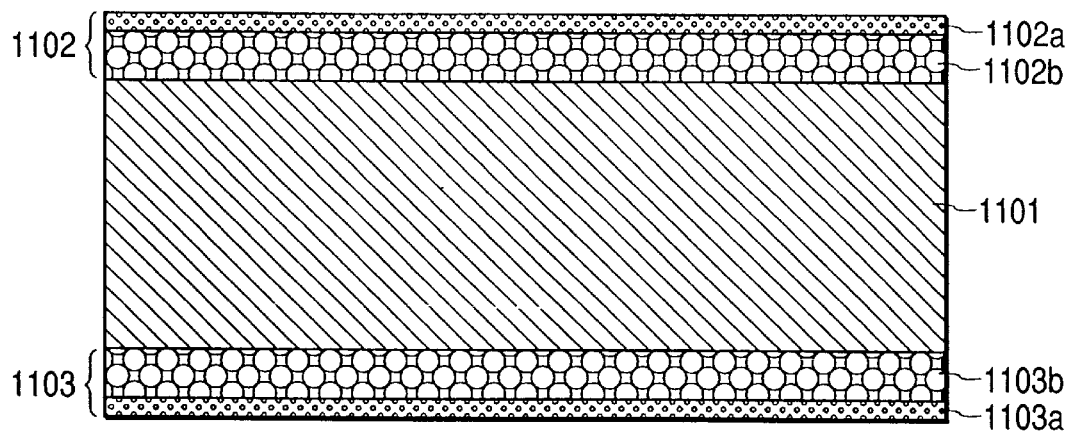
FIG. 10 is a schematic cross-section of a silicon wafer on which a porous silicon layer is formed in Embodiment 2 of the present invention.

However, in order to form an epitaxial silicon layer having neither abnormal growth nor layer defects, it is better for the porous silicon layer coming into contact with the epitaxial silicon layer to have a smaller porosity. On the other hand, in order to etch the porous silicon layer selectively with respect to the epitaxial silicon layer, it is better for the porous silicon layer to have a larger porosity. Namely, it is an ideal form that the porous silicon layer has a small porosity on its surface side and has a large porosity on its interior side. FIG. 10 cross-sectionally illustrates this ideal form of the porous silicon layer. Reference numeral 1101 denotes a non-porous silicon layer not made porous of the silicon wafer; and 1102 and 1103, porous silicon layers. In this form, porous silicon layers 1102a and 1103a having small porosity are formed on the surface sides of the porous silicon layers 1102 and 1103, respectively, and porous silicon layers 1102b and 1103b having large porosity are formed on the interior sides of the porous silicon layers 1102 and 1103, respectively. To form this structure, the wafer is anodized at a small current density at an initial stage where its portions corresponding to 1102a and 1103a are anodized and is anodized at a large current density at a later stage where its portions corresponding to 1102b and 1103b are anodized. As the result, the porous silicon layer can be etched selectively with respect to the epitaxial silicon layer, and also the epitaxial silicon layer having neither abnormal growth nor layer defects can be formed on the porous silicon layers 1102 and 1103.

Figure 11:
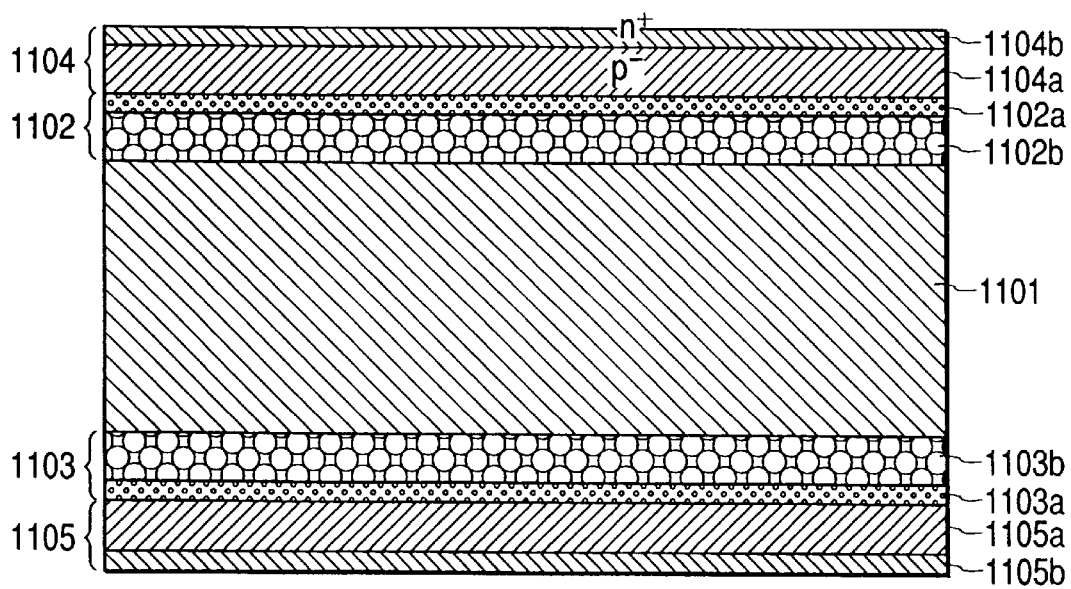
FIG. 11 is a schematic cross-section of a silicon wafer on which a silicon layer is further formed by epitaxial growth on the porous silicon layer in Embodiment 2 of the present invention.

FIG. 11 is a cross-sectional view of an instance where epitaxial silicon layers are formed on the porous silicon layers 1102 and 1103. First, on the porous silicon layers 1102a and 1103a, p$^-$-type epitaxial silicon layers 1104a and 1105a are grown and then n$^+$-type epitaxial silicon layers 1104b and 1105b are grown thereon, respectively. The epitaxial silicon layers 1104 and 1105 may preferably be formed by liquid-phase growth, molecular beam epitaxial growth, plasma-assisted CVD, low-pressure CVD, photo-assisted CVD or bias sputtering.

Figure 12:
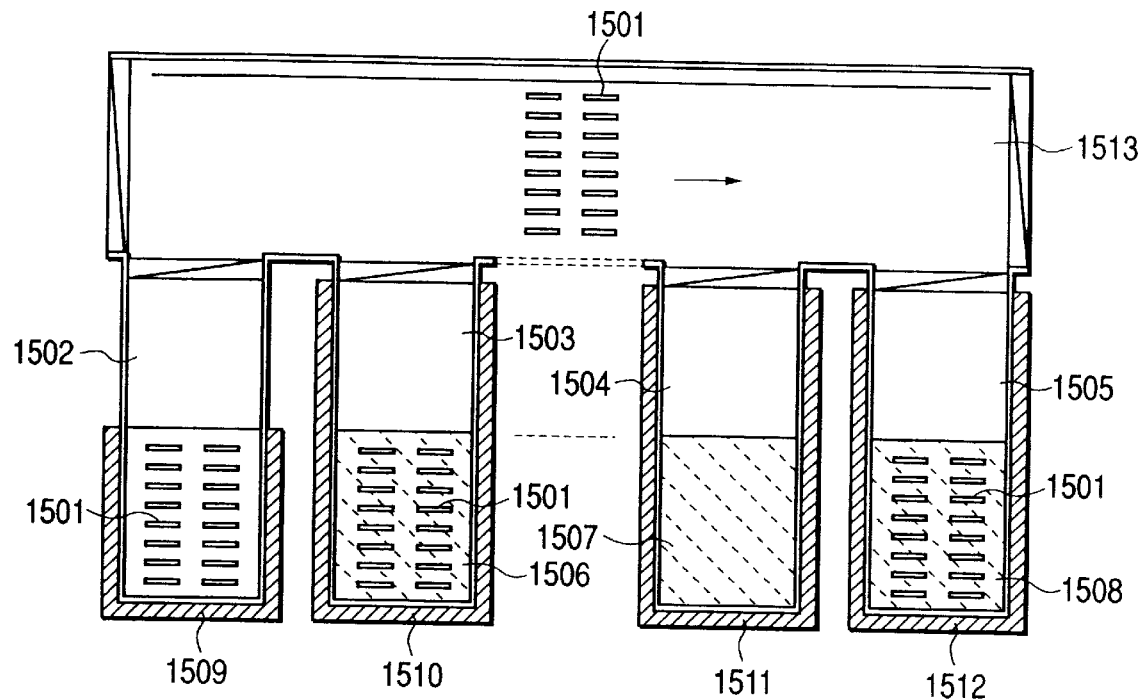
FIG. 12 is a schematic cross-section of a liquid-phase growth system by which the epitaxial layer is formed in Embodiment 2 of the present invention.

FIG. 12 is a cross-sectional view of a mass-production dipping type liquid-phase growth system for growing the epitaxial silicon layers 1104 and 1105 by liquid-phase growth. In FIG. 12, reference numeral 1501 denotes a substrate cassette which supports a plurality of growth substrates; 1502, a hydrogen annealing chamber; 1503 and 1504, p$^-$-type silicon layer growth chambers; 1505, an n$^+$-type layer growth chamber; 1506, 1507 and 1508, melts; 1509, 1510, 1511 and 1512, electric furnaces; and 1513, a substrate cassette transport chamber. To effect epitaxial growth on the porous silicon layers 1102 and 1103, the surfaces of the porous silicon layers 1102 and 1103 may preferably beforehand be annealed in an atmosphere of hydrogen to make the surfaces smooth. For this purpose, in the hydrogen annealing chamber 1502, the substrate cassette 1501 led into the liquid-phase growth system is first annealed at about 1,040° C. in an atmosphere of hydrogen.

Thereafter, the substrate cassette 1501 is passed through the transport chamber 1513 and led into the p$^-$-type silicon layer growth chamber 1503, where p$^-$-type silicon layers 1104a and 1105a are formed by epitaxial growth on the porous silicon layers 1102 and 1103, respectively, in the liquid phase. The p$^-$-type silicon layer growth chambers 1503 and 1504 are so provided in plurality because the p$^-$-type silicon layers are formed in a larger thickness than the n$^+$-type layer. In the present embodiment, it is assumed that there are six p$^-$-type silicon layer growth chambers (only two among these are shown in the drawing), one n$^+$-type layer growth chamber and one hydrogen annealing chamber. The p$^-$-type silicon layer may preferably be in a thickness of from 10 to 50 $\mu$m, and more preferably from 20 to 40 $\mu$m, from the viewpoint of effective utilization of electricity generating light, effective utilization of materials and flexibility of solar cells.

To form the p$^-$-type epitaxial silicon layers 1104a and 1105a, first, a melt 1506 comprising indium (In) or tin (Sn) is heated to about 960° C. by the aid of an electric furnace 1510. A p$^-$-type silicon substrate for dissolution is immersed into the melt 1506 to dissolve p$^-$-type silicon into the melt 1506, and then the p$^-$-type silicon substrate for dissolution is drawn up.

Thereafter, the melt 1506 is kept at a temperature of about 950° C., and the melt 1506 is made to be supersaturated with the p$^-$-type silicon. Then, the substrate cassette 1501 is immersed into the melt 1506, and the temperature of the electric furnace 1510 is adjusted to drop the temperature of the melt 1506 gradually, thus epitaxial p$^-$-type silicon layers 1104a and 1105a are grown on the porous silicon layers 1102 and 1103, respectively. Growth time is as long as 30 minutes, and hence the production is made efficient while using the p⁻-type silicon layer growth chambers 1503 and so forth provided in plurality and while growing the p⁻-type silicon layers simultaneously in a plurality of substrate cassettes.

Thereafter, the substrate cassette 1501 is passed through the transport chamber 1513 and led into the n⁺-type layer growth chamber 1505, where the n⁺-type silicon layers 1104b and 1105b are formed by epitaxial growth on the p⁻-type silicon layers 1104a and 1105a in the liquid phase. To form the n⁺-type silicon layers 1104b and 1105b, first, a melt 1508 comprising In or Sn is heated to about 960° C. by the aid of an electric furnace 1512. An n⁺-type silicon substrate for dissolution is immersed into the melt 1508 to dissolve n⁺-type silicon into the melt 1508, and then the n⁺-type silicon substrate for dissolution is drawn up. Alternatively, n-type impurities such as P (phosphorus) or As (arsenic) may be dissolved into it together with a substrate having a low concentration.

Thereafter, the melt 1508 is kept at a temperature of about 960° C., and the melt 1508 is made to stand supersaturated with the n⁺-type silicon. Then, the substrate cassette 1501 is immersed into the melt 1508, and the temperature of the electric furnace 1512 is adjusted to drop the temperature of the melt 1508 gradually; thus, epitaxial n⁺-type silicon layers 1104b and 1105b are grown on the p⁻-type silicon layers 1104a and 1105a, respectively. Growth time is about 30 seconds.

Figure 13:
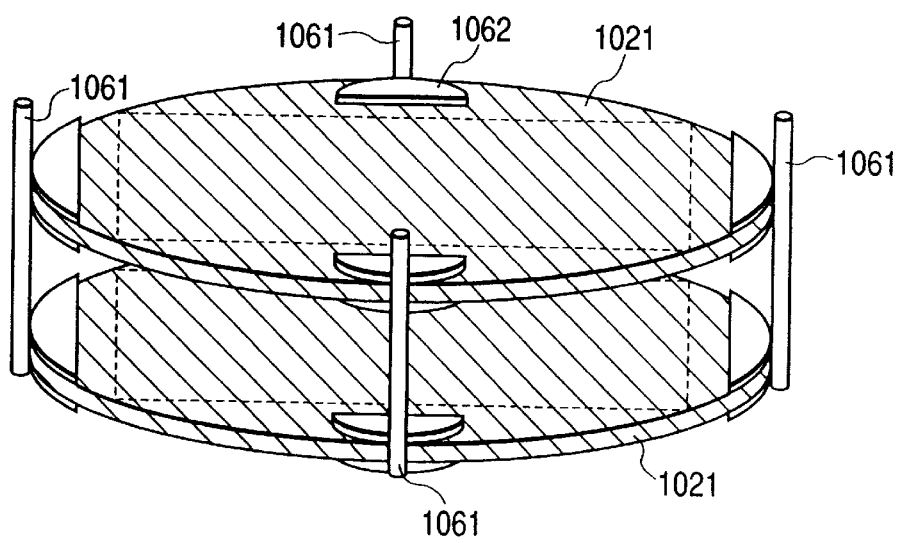
FIG. 13 is a schematic perspective view of a substrate cassette used in Embodiment 2 of the present invention.

FIG. 13 is a detailed perspective view of the substrate cassette 1501. Four columns 1061 are provided to support a plurality of silicon wafers 1021 at four points each. The columns 1061 have a structure wherein they support silicon wafers only at their edges so that the epitaxial growth can take place on both sides of the silicon wafers 1021. In a later step after the production of solar cells, the epitaxial silicon layers 1104 and 1105 serving as electricity generation layers are cut off in quadrangles as shown by dotted lines by utilizing crystal cleavage. Hence, the columns 1061 may preferably support the silicon wafers 1021 only at their portions cut off together with orientation flats 1062. In the dipping type liquid-phase growth system as shown in FIG. 12, the columns 1061 are immersed in melts heated to about 1,000° C., and hence may preferably be made of heat-resistant materials such as quartz. The substrate cassette 1501 having this structure can be used not only in a liquid-phase growth system, but also in CVD or a similar gaseous-phase growth system.

Figure 14:
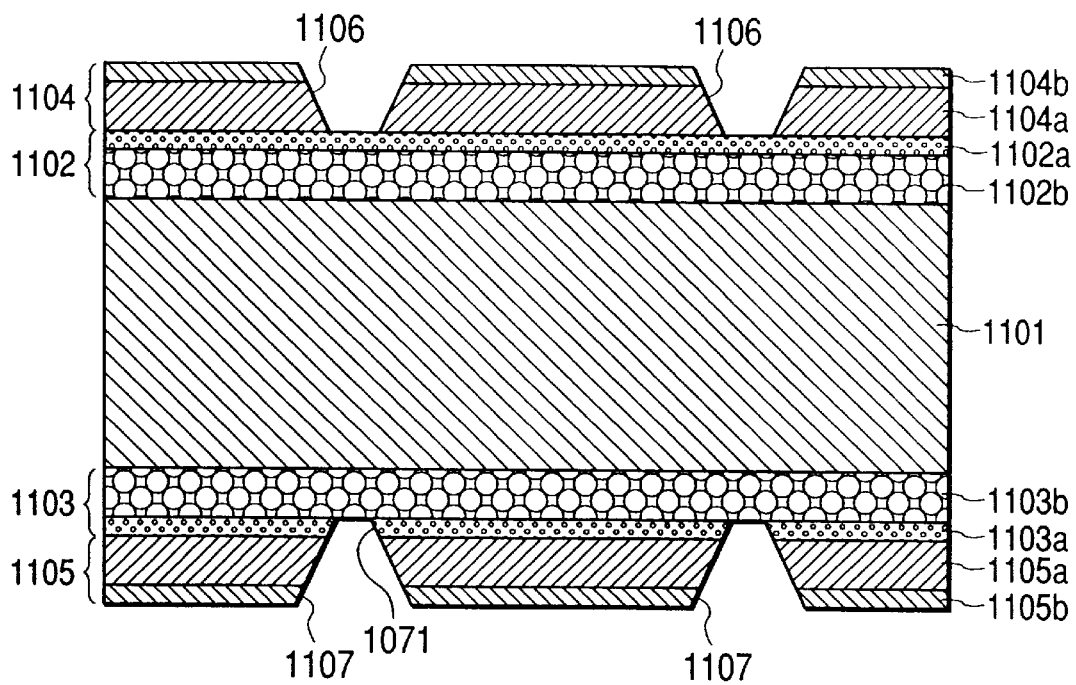
FIG. 14 is a schematic cross-section of the step of forming through openings in Embodiment 2 of the present invention.

FIG. 14 is a cross-sectional view showing the step of making through holes 1106 and 1107 in the epitaxial silicon layers 1104 and 1105. The through holes 1106 and 1107 are entrances for the etchant which etches the porous silicon layers 1102 and 1103 selectively with respect to the non-porous silicon layer 1101 and epitaxial silicon layers 1104 and 1105, and also serve as areas through which contact electrodes pass in a later step. The through holes 1106 and 1107 may be made by using a laser or by FIB (focused ion beams) or photolithography. Taking account of lowering the occurrence of defects and productivity, they may preferably be made using a laser. Also, since insulating layers and contact electrodes are formed in the through holes 1106 and 1107 at a later step, the through holes may preferably have slightly oblique sidewalls as shown in FIG. 14. The through holes 1106 and 1107 may preferably be made in a diameter of from about 10 to 500 μm and at intervals of from 50 μm to 5 mm. When the through holes 1106 and 1107 are made, not only the silicon layers are etched until the porous silicon layers 1102 and 1103 come to be seen, but also the porous silicon layer 1103 may also be etched to a certain extent as in a through hole 1071 so as to be etched until the porous silicon layer 1103b having a large porosity is seen. Thus, since the etching is made until the porous silicon layer 1103b is seen, its selective etching can be accelerated.

Figure 15A:
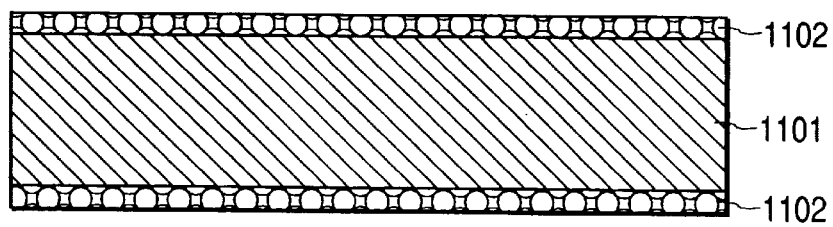
FIGS. 15A and 15B are schematic cross-sections showing the steps of regenerating a silicon wafer in Embodiment 2 of the present invention.

Thereafter, the porous silicon layers 1102 and 1103 are selectively wet-etched through the through holes 1106 and 1107, respectively. Selective etching is carried out by immersing in an etchant the substrate unit shown in FIG. 14. As a result, the etchant enters the porous silicon layers 1102 and 1103 from the through holes 1106 and 1107; thus, the epitaxial silicon layers 1104 and 1105 can efficiently be separated from the non-porous silicon layer 1101. The etchant includes typical silicon etchants, and porous-silicon etchants such as a hydrofluoric acid solution, a mixture solution of hydrofluoric acid and an alcohol, a mixture solution of hydrofluoric acid and hydrogen peroxide water, a buffered hydrofluoric acid solution, a mixture solution of buffered hydrofluoric acid and an alcohol, and a mixture solution of buffered hydrofluoric acid and hydrogen peroxide water. In view of production efficiency, the porous silicon layers 1102 and 1103 may preferably completely be removed at the time the separation of the epitaxial silicon layers 1104 and 1105 from the non-porous silicon layer 1101 has been completed. When, however, the porous silicon layers 1102 and 1103 remain on the non-porous silicon layer 1101 after separation as shown in FIG. 15A, the etching is further continued until only the non-porous silicon layer 1101 is left. This non-porous silicon layer 1101 is repeatedly used as the silicon wafer 1021 in the steps of anodizing shown in FIG. 9 to reduce production cost.

Figure 15B:
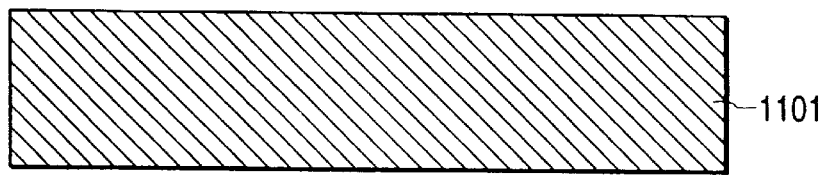
Figure 16A:
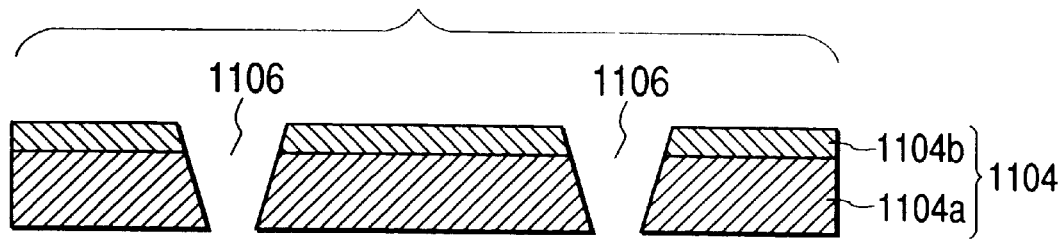
FIGS. 16A, 16B and 16C are schematic cross-sections showing steps in the process for producing a solar cell in Embodiment 2 of the present invention.

FIGS. 16A to 16C and FIGS. 17A to 17C illustrate a process for producing a solar cell. Component parts are marked by reference numerals like those in FIGS. 8A to 8D to FIGS. 15A and 15B. FIG. 16A is a cross-sectional view of the epitaxial silicon layer 1104 separated from the non-porous silicon layer 1101. At this stage, the texture treatment may previously be made on its surface in order to lessen any reflection loss of incident light on the solar cell. The texture treatment is to immerse the epitaxial silicon layer 1104 in hydrazine, NaOH or KOH to form a pyramidic uneven structure on the surface of the epitaxial silicon layer 1104.

Figure 16B:
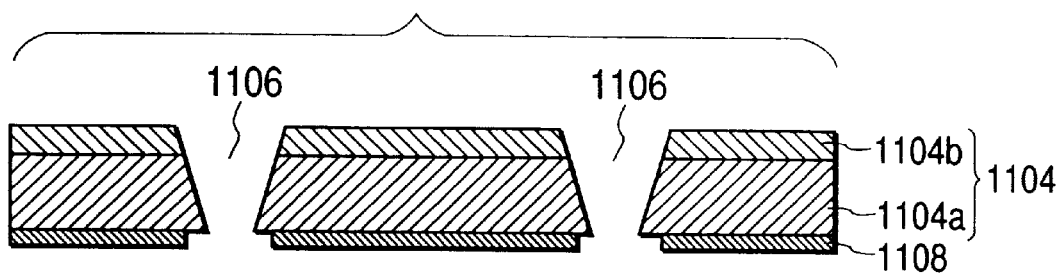

FIG. 16B shows the step of forming a back electrode 1108 which functions as both a collector electrode and a light reflecting layer. The back electrode 1108 has holes a little larger than the through holes 1106, at the position of the through holes 1106. The back electrode 1108 may be formed by attaching an aluminum sheet having a diameter a little larger than the through holes 1106, under registration of the position of the through holes 1106 and the position of the holes of the back electrode 1108. Alternatively, it may be formed by using a silver paste or by screen printing. In the case when the back electrode 1108 is formed of an aluminum material, upon heat treatment, aluminum enters silicon and the silicon in the vicinity of the back electrode turns into p⁺-type.

Figure 16C:
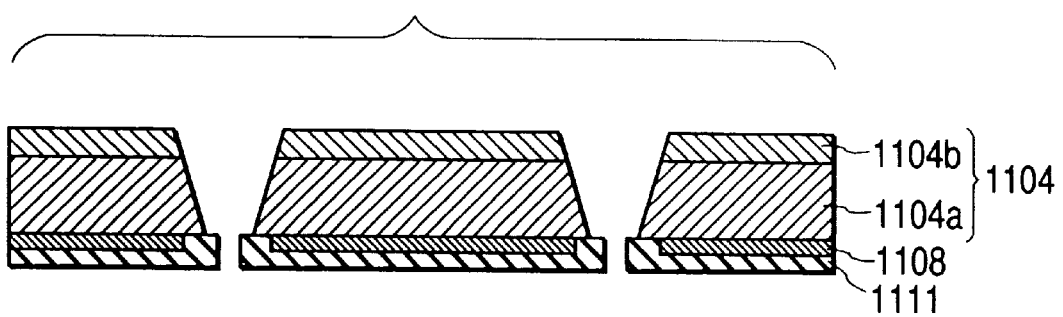

Next, FIG. 16C shows the step of forming an insulating layer 1111 on the back of the back electrode 1108. The insulating layer 1111 is formed by attaching an insulating sheet having holes a little smaller than the holes of the back electrode 1108 at the position of the through holes 1106 under registration.

Figure 17A:
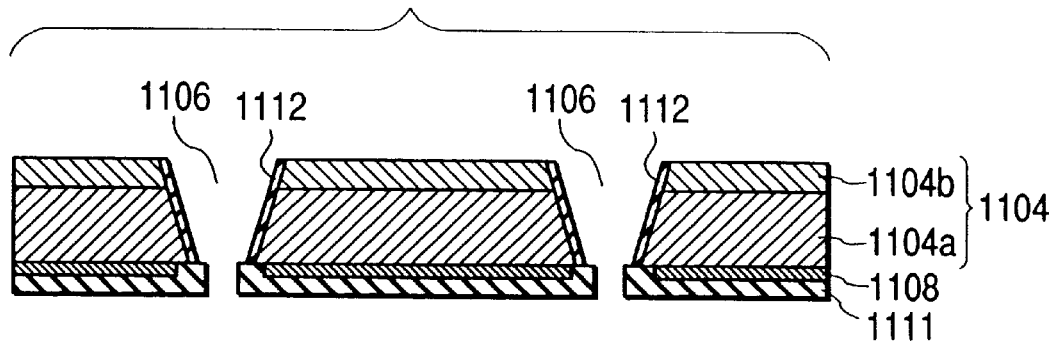
FIGS. 17A, 17B and 17C are schematic cross-sections showing steps in the process for producing the solar cell in Embodiment 2 of the present invention.
Figure 17B:
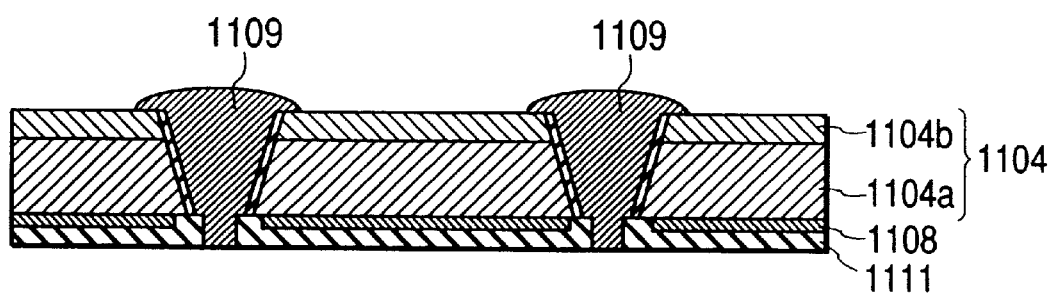
Figure 17C:
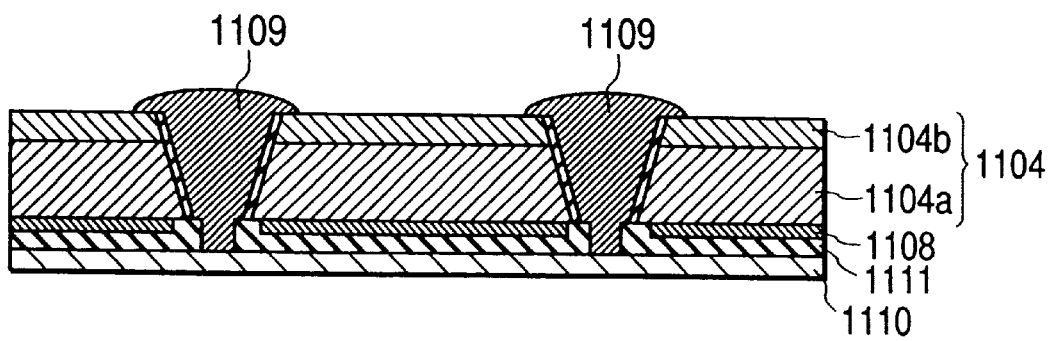

FIG. 17A shows the step of forming insulating regions 1112 in the through holes 1106 (an insulation step). In this insulation step, the insulating regions 1112 can be formed by covering an insulating sheet or by laser irradiation in an atmosphere of oxygen or hydrogen to oxidize silicon at the surfaces of the through holes 1106. FIG. 17B shows the step of forming contact electrodes 1109 in the through holes 1106. The contact electrodes 1109 may be formed by coating a copper paste in the through holes 1106 and the vicinities thereof by screen printing, followed by baking. FIG. 17C shows the step of attaching a base conductive substrate 1110. The base conductive substrate 1110 may be formed of SUS stainless steel, a conductive-coated plastic sheet, or glass. The epitaxial silicon layer 1104 is so thin as to be flexible, and the base conductive substrate 1110 may be a curved substrate without any problem.

Figure 18A:
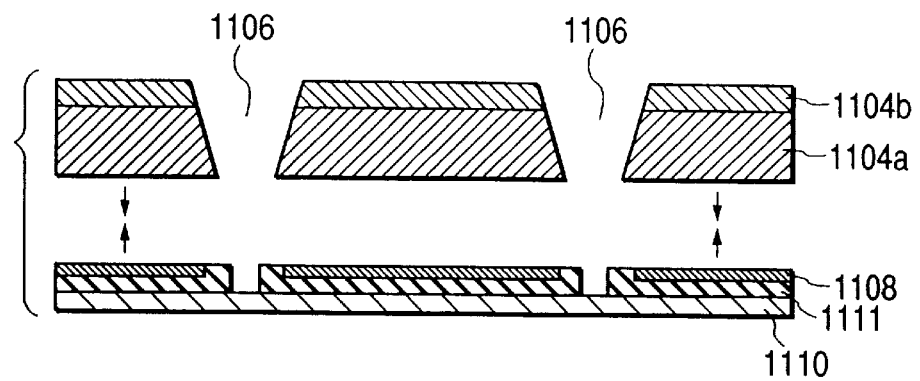
FIGS. 18A, 18B, 18C and 18D are schematic cross-sections showing steps in the process for producing the solar cell in Embodiment 2 of the present invention.
Figure 18B:
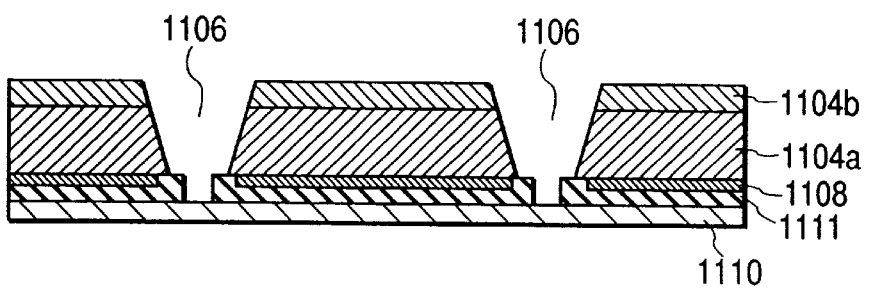
Figure 18C:
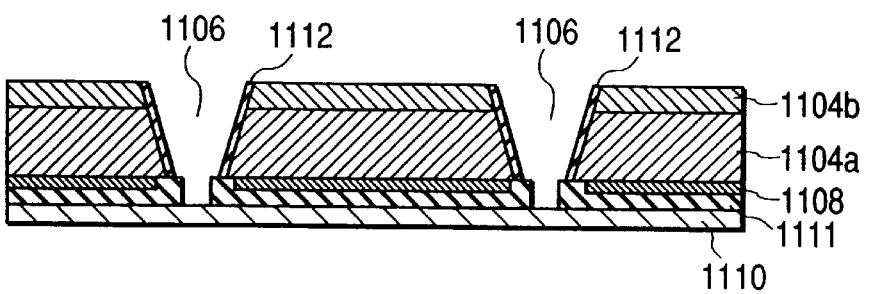
Figure 18D:
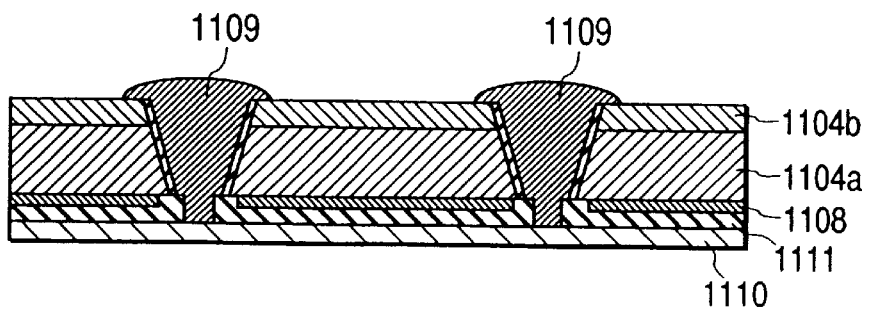

The steps shown in FIGS. 17A, 17B and 17C may be taken in any order. For example, first, the base conductive substrate 1110 is attached as shown in FIG. 18B, followed by the step of forming the insulating regions 1112 on the wall surfaces of the through holes 1106 as shown in FIG. 18C. Thereafter, the step of forming the contact electrodes 1109 as shown in FIG. 18D may be carried out. Alternatively, as shown in FIG. 18A, first, a base conductive substrate 1110 having the insulating layer 1111 and the back electrode 1108 may previously be prepared, and to this substrate the epitaxial silicon layer 1104 may be attached, followed by the subsequent steps shown in FIGS. 18B, 18C and 18D. Not shown in the drawings, an anti-reflection film formed of $TiO_2$ or ITO (indium tin oxide) may finally be formed on the light-incident surface, the surface of the $n^+$-type silicon layer 1104b. This is preferable for improving light incidence. A unit cell is completed through the foregoing steps. Then, the non-porous silicon layer remaining after one cycle of processing as shown in FIG. 15B is used as the silicon wafer for the subsequent cycles to produce unit cells in a large quantity.

Figure 19A:
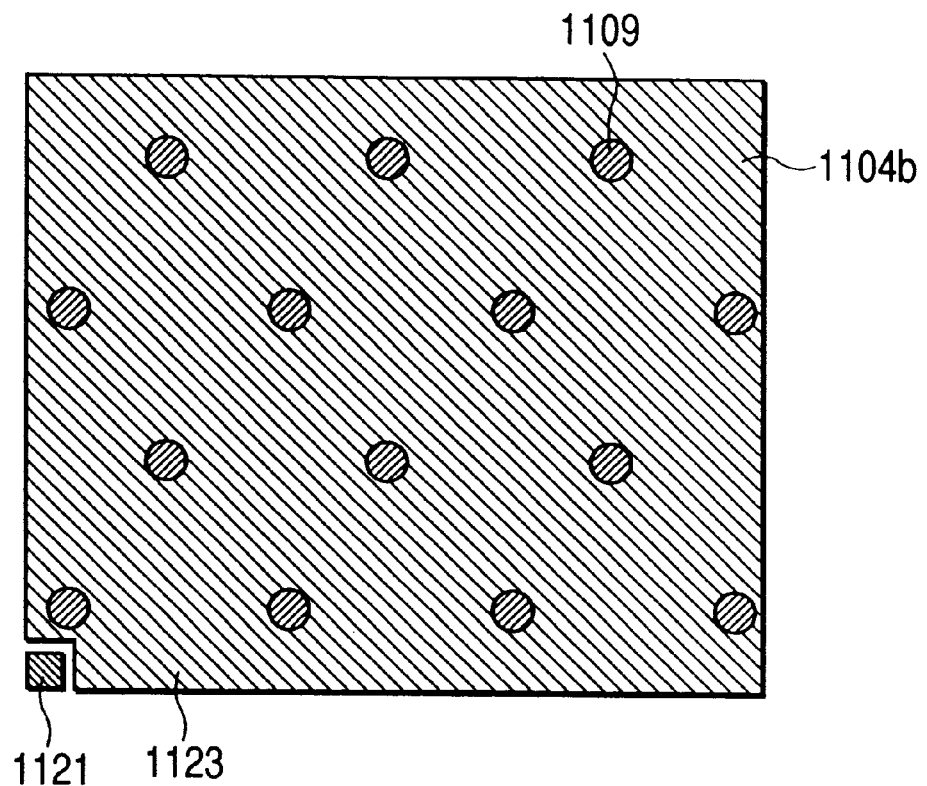
FIGS. 19A and 19B are a solar cell plan view (FIG. 19A) and an equivalent circuit of a solar cell module (FIG. 19B) in Embodiment 2 of the present invention.
Figure 19B:
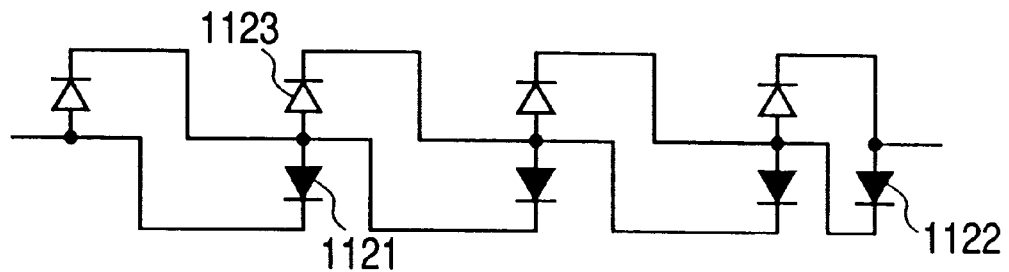

FIGS. 19A and 19B are a plan view (FIG. 19A) of the unit cell produced through the above steps and an equivalent circuit (FIG. 19B) of a solar cell module having the unit cells. On the surface of the unit cell, the surface of the $n^+$-type silicon layer 1104b and the tops of the contact electrodes 1109 are seen through the anti-reflection film. What is shown at the left lower part in FIG. 19A is a bypass diode 1121 formed at part of the unit cell 1123 and has the function to prevent electric currents from flowing back in the solar cell. The bypass diode 1121 is formed in the same step of forming the through holes shown in FIG. 14, which is formed by, e.g., separating the $n^+$-type silicon layer 1104b using a laser. The bypass diode 1121 is connected with the unit cell 1123 in the manner as shown by the equivalent circuit in FIG. 19B. In the bypass diode 1121 for the unit cell 1123 shown at the far left in FIG. 19B, an external bypass diode 1122 on the far right side is used.

Figure 20A:
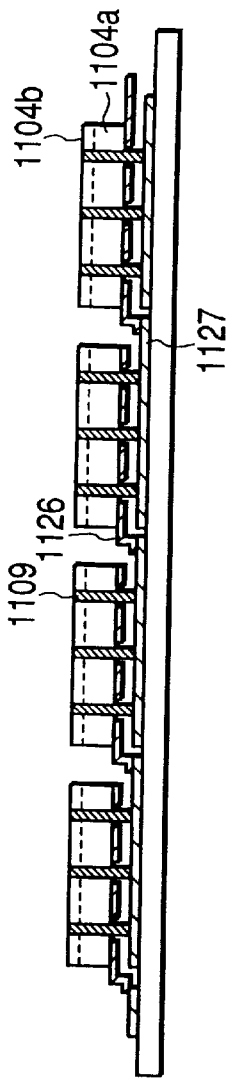
FIGS. 20A, 20B and 20C are cross-sections of the solar cell module (FIGS. 20A and 20C) and a plan view thereof (FIG. 20B) in Embodiment 2 of the present invention.
Figure 20B:
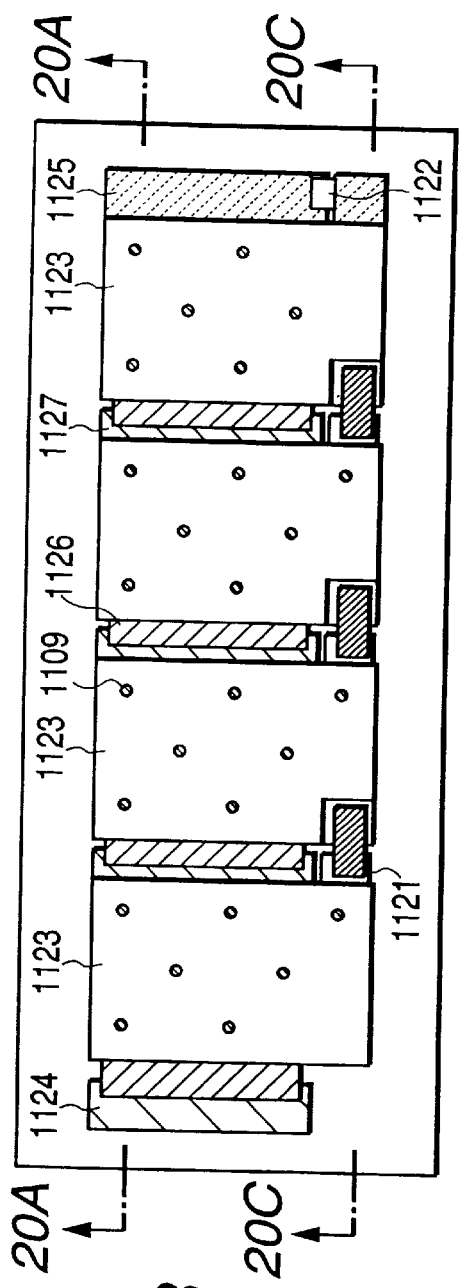
Figure 20C:
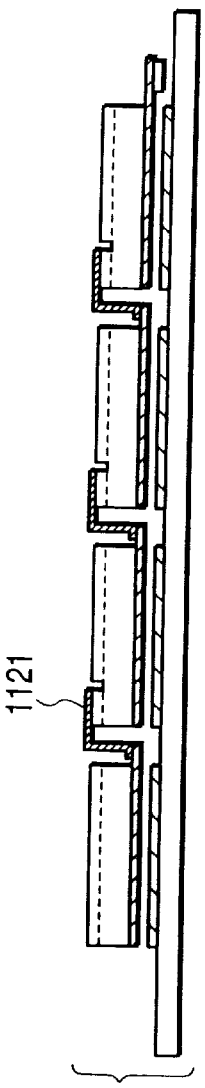

FIG. 20B is a plan view of the solar cell module at its photovoltaic areas. FIG. 20A is a cross-section along the line 20A—20A in the plan view FIG. 20B at the photovoltaic area, and FIG. 20C is a cross-section along the line 20C—20C in the plan view FIG. 20B at the bypass diode area. In FIGS. 20A to 20C, reference numeral 1124 denotes a positive electrode; 1125, a negative electrode; 1126, a p-side electrode tab; and 1127, an n-side electrode tab. In FIGS. 20A to 20C, other reference numerals are the same as those of members described in the previous drawings, and the description is omitted.

Here, the bypass diode 1128 has a bypass diode tab. The bypass diode tab electrically interconnects the cathode of the bypass diode 1121 with the p-side electrode tab 1126 of the unit cell 1123, and also functions as light-screening layer of the bypass diode 1121. As for materials, it may preferably be formed of aluminum or chromium. Other than the left-end unit cell 1123, its p-side electrode tab 1126 is connected to the n-side electrode tab 1127 of the next unit cell 1123 on the left side. With regard to the left-end unit cell 1123, its p-side electrode tab 1126 is connected to the positive electrode 1124. With regard to the right-end unit cell 1123, its n-side electrode tab 1127 is connected to the negative electrode 1125 and the anode of the external diode 1122, and its p-side electrode tab 1126 is connected to the cathode of the external diode 1122. As a result, photovoltaic power is caused across the positive electrode 1124 and the negative electrode 1125; thus, an electric power can be obtained as a solar cell.

In the present Embodiment 2, epitaxial semiconductor layers are grown on a semiconductor substrate on both sides, through openings are made in the epitaxial semiconductor layers thus grown, an etchant is made to enter through the through openings to etch porous semiconductor layers selectively, and the epitaxial silicon layers are separated from the semiconductor substrate. According to the present embodiment, two unit cells can be produced in one cycle, and hence solar cells can be produced at a low cost. Also, a great difference in etching rate between the porous semiconductor layers and the non-porous semiconductor layer is utilized to separate the epitaxial semiconductor layers, and hence epitaxial semiconductor layers having a very high uniformity can be separated.

Embodiment 3

Embodiment 3 of the present invention will be described in detail with reference to the drawings. The present Embodiment is substantially the same as Embodiment 2 when described with reference to FIGS. 8A to 8D, but is an embodiment in which, when the thin-film semiconductors 1004 and 1005 are separated from the substrate 1001, a pressing member is pressed against the separation layer 1002 or 1003 or the substrate 1001 through the through openings 1006 or 1007. In Embodiment 3, too, the substrate 1001 is described as a silicon wafer. Alternatively, a metallurgical-grade silicon substrate or a compound semiconductor substrate of GaAs may also be used as the substrate 1001. The separation layers 1002 and 1003 are also described as porous silicon layers, and the thin-film semiconductors 1004 and 1005 as single-crystal epitaxial silicon layers. Alternatively, the separation layers 1002 and 1003 may be noted as common porous silicon layers, and the thin-film semiconductors 1004 and 1005 as common semiconductor layers inclusive of polycrystalline ones.

Figure 21A:
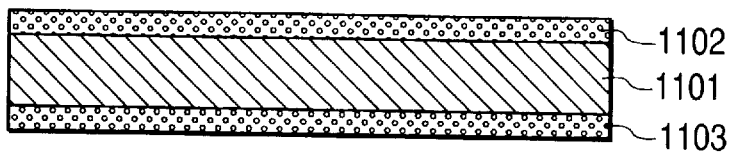
FIGS. 21A, 21B, 21C and 21D are schematic cross-sections showing steps in the process for producing a solar cell in Embodiment 3 of the present invention.
Figure 21B:
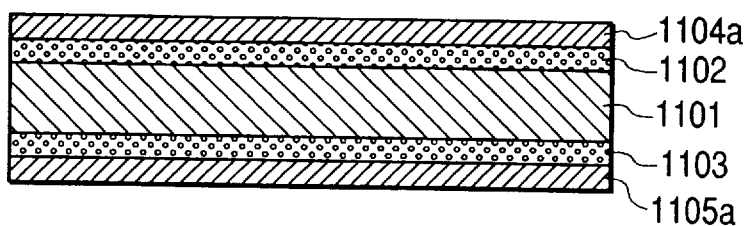
Figure 21C:
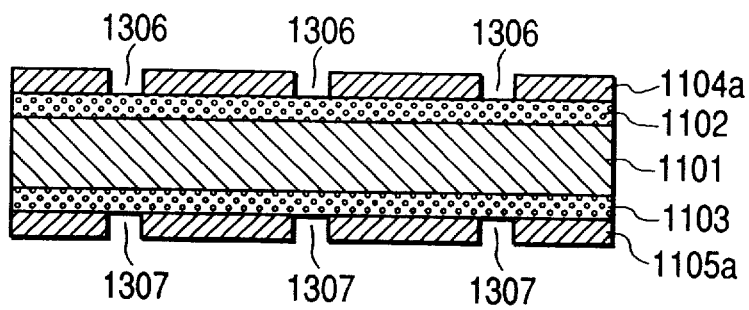

FIGS. 21A to 21D through FIGS. 23A to 23D are cross-sectional views showing a production process of Embodiment 3. First, as shown in FIG. 21A, a silicon wafer is anodized in the same manner as described with reference to FIG. 9 to form porous silicon layers 1102 and 1103 on a non-porous silicon layer 1101 on both surfaces. Thereafter, as shown in FIG. 21B, $p^-$-type silicon layers 1104a and 1105a are formed by epitaxial growth on the porous silicon layers 1102 and 1103, respectively, in substantially the same manner as described with reference to FIGS. 12 and 13. Thereafter, as shown in FIG. 21C, through holes 1306 and 1307 are made in both $p^-$-type silicon layers 1104a and 1105a until the porous silicon layers 1102 and 1103 are seen. This step is carried out by, e.g., laser beam irradiation after the growth of the $p^-$-type silicon layers 1104a and 1105a has been completed in the liquid-phase growth system shown in FIG. 12.

Figure 21D:
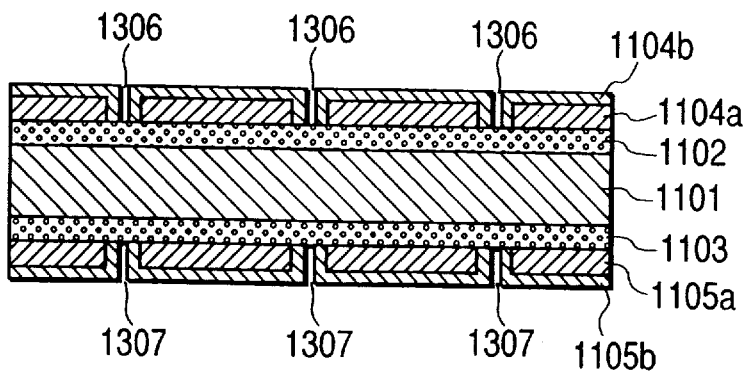

Next, as shown in FIG. 21D, $n^+$-type silicon layers 1104b and 1105b are grown in such a form that they cover the surfaces of the $p^-$-type silicon layers 1104a and 1105a and the sidewalls of the through holes 1306 and 1307, respectively. This step is also carried out using the liquid-phase growth system shown in FIG. 12.

Figure 22A:
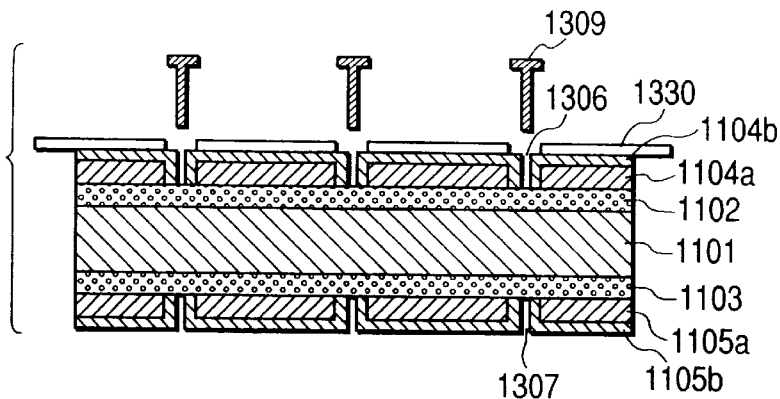
FIGS. 22A, 22B, 22C and 22D are schematic cross-sections showing steps in the process for producing the solar cell in Embodiment 3 of the present invention.

Thereafter, the substrate is taken out of the liquid-phase growth system and, as shown in FIG. 22A, a supporting substrate 1330 having holes made correspondingly to the through holes 1306 is attached onto the n$^+$-type silicon layer 1104b. The supporting substrate 1330 is used later as a surface layer of a solar cell, and hence a transparent material is used. Of course, the supporting substrate 1330 may be peeled later from the n$^+$-type silicon layer 1104b. In such a case, the supporting substrate 1330 may be an opaque one. Then, contact electrodes 1309 are inserted in the interiors of the through holes 1306 while supporting the n$^+$-type silicon layer 1104b and the p$^-$-type silicon layer 1104a with the supporting substrate 1330, whereupon the contact electrodes 1309 press down the porous silicon layer 1102 or the non-porous silicon layer 1101.

Figure 22B:
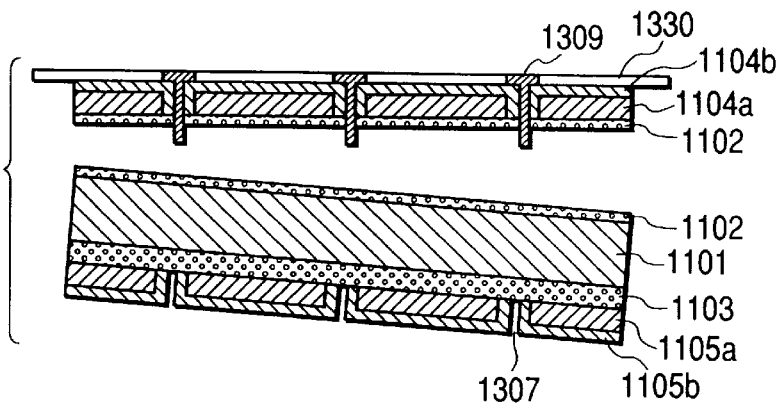

As a result, as shown in FIG. 22B, the non-porous silicon layer 1101 and the epitaxial silicon layer 1104 come apart at the porous silicon layer 1102 having a brittle structure. In the present embodiment, it is intended for the contact electrodes 1309 to be used as the pressing member for pressing the porous silicon layer 1102 or non-porous silicon layer 1101 and thereafter to function as the contact electrodes 1309 themselves. Alternatively, a member exclusively used as the pressing member may be used, and the contact electrodes 1309 may be formed independently.

Figure 22C:
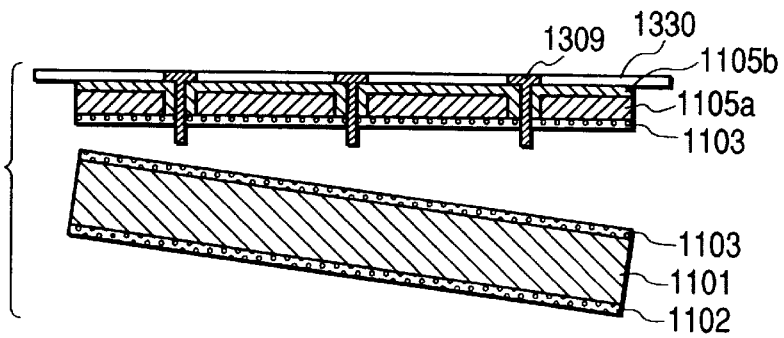

Next, in the same manner as shown in FIG. 22A, the back-side epitaxial silicon layer 1105 is separated from the non-porous silicon layer 1101 by the use of the through holes 1307 like the manner shown in FIG. 22C. Thereafter, as shown in FIG. 22, the selective etching carried out in Embodiment 1 is carried out to remove the porous silicon layers 1102 and 1103. Thereafter, the non-porous silicon layer 1101 shown in FIG. 22D is anodized by means of the anodizing apparatus shown in FIG. 9 to form the porous silicon layers on both sides, and then is used again in the steps starting from the step shown in FIG. 21A.

Figure 22D:
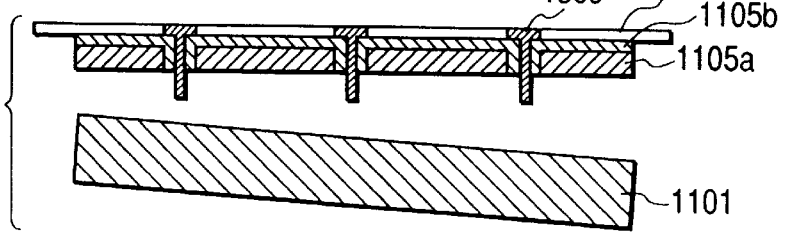
Figure 23A:
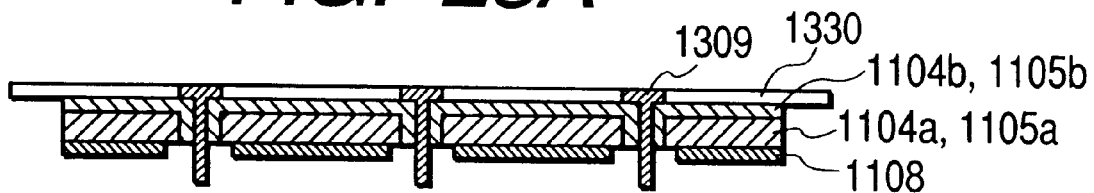
FIGS. 23A, 23B, 23C and 23D are schematic cross-sections showing steps in the process for producing the solar cell in Embodiment 3 of the present invention.
Figure 23B:
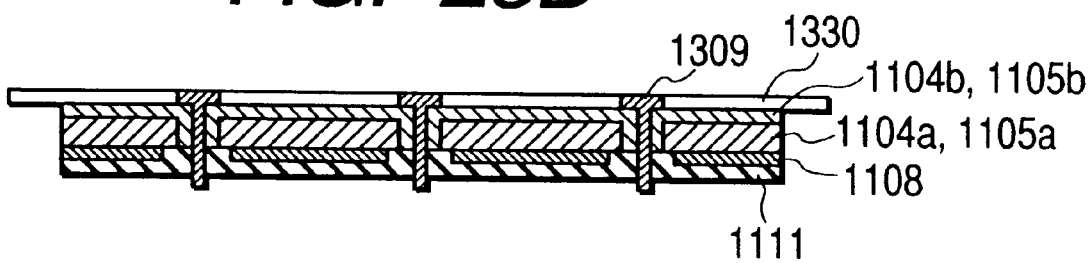
Figure 23C:
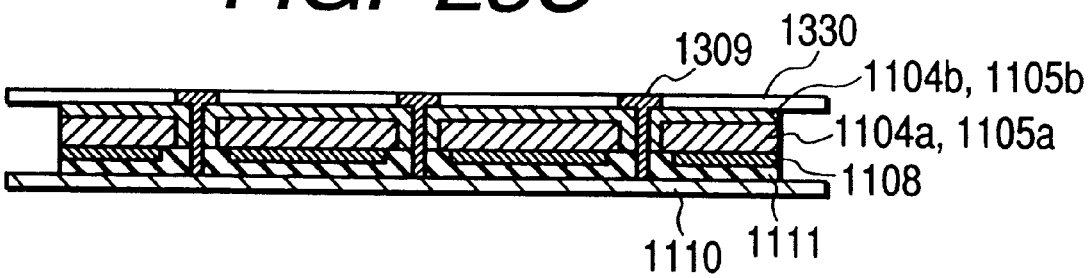
Figure 23D:
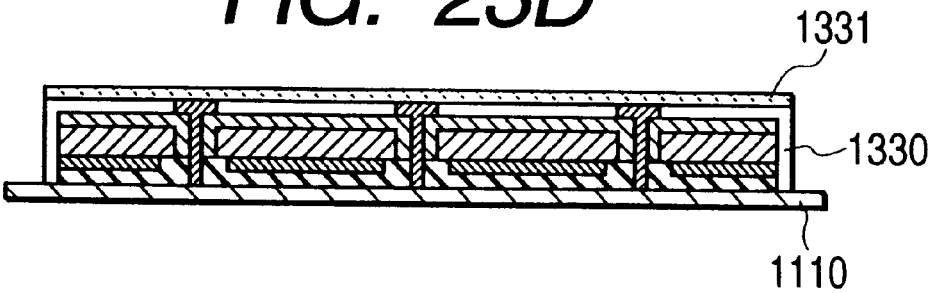

How the epitaxial silicon layers 1104 and 1105 separated through the steps shown in FIGS. 22B to 22D are post-treated will be described according to the flow sheet shown in FIGS. 23A to 23D. On the side of the epitaxial silicon layer 1104 or 1105, as shown in FIG. 23A, a back electrode 1108 is formed on the p$^-$-type silicon layers 1104a and 1105a. Next, as shown in FIG. 23B, an insulating layer 1111 is formed on the back electrode 1108, and, as shown in FIG. 23C, a base conductive substrate 1110 is attached to the insulating layer 1111. Then, as shown in FIG. 23D, the edges of the supporting substrate 1330 are bent down so as to function as a protective layer of the epitaxial silicon layers 1104 and 1105, and an anti-reflection layer 1331 is formed thereon.

According to the present Embodiment 3, the porous silicon layer or non-porous silicon layer is pressed through the through openings to separate the epitaxial silicon layer from the non-porous silicon layer. Hence, separation can be made at a high speed and surely. In the manner of separation by selective etching in the process of Embodiment 2, the epitaxial silicon layer is undesirably etched to a small extent. However, the process of Embodiment 3 etches the epitaxial silicon layer less than the process of Embodiment 2.

Embodiment 4

Embodiment 4 of the present invention will be described with reference to the drawings. The present embodiment is substantially the same as Embodiment 2, but makes use of an insulating layer in order to form the through openings 1006 and 1007 shown in FIGS. 8A to 8D. In the present embodiment, too, the substrate 1001 is described as a silicon wafer. Alternatively, a metallurgical-grade silicon substrate or a compound semiconductor substrate of GaAs may also be used as the substrate 1001. The separation layers 1002 and 1003 are also described as porous silicon layers, and the thin-film semiconductors 1004 and 1005 as single-crystal epitaxial silicon layers. Alternatively, the separation layers 1002 and 1003 may be noted as common porous silicon layers, and the thin-film semiconductors 1004 and 1005 as common semiconductor layers inclusive of polycrystalline ones.

Figure 24A:
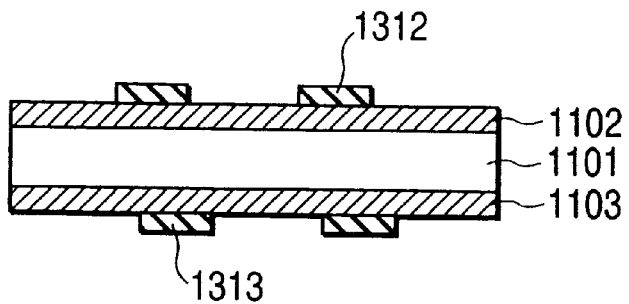
FIGS. 24A, 24B and 24C are schematic cross-sections showing steps in the process for producing a solar cell in Embodiment 4 of the present invention.
Figure 24B:
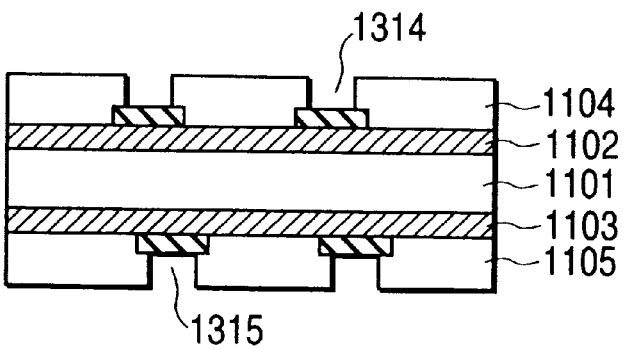
Figure 24C:
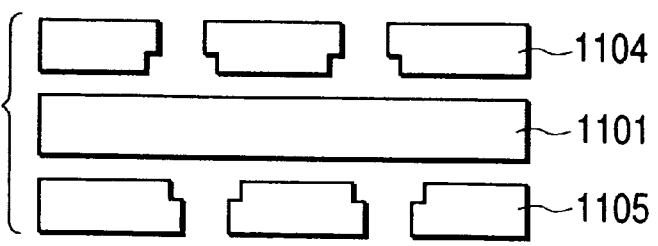

FIGS. 24A to 24C through FIGS. 25A to 25D are cross-sectional views showing a production process of Embodiment 4. First, a silicon wafer 1101 is anodized in the same manner as described with reference to FIG. 9 to produce a substrate comprising a non-porous silicon layer 1101 on both surfaces of which porous silicon layers 1102 and 1103 have been formed. Next, as shown in FIG. 24A, the surfaces of the porous silicon layers 1102 and 1103 are oxidized to form oxide layers, which are then patterned by photolithography. The patterned oxide layers are selectively removed by etching its areas other than oxide regions 1312 and 1313. Thereafter, epitaxial silicon layers 1104 and 1105 are formed on the porous silicon layers 1102 and 1103, respectively. Here, no epitaxial layers are grown on the oxide insulating regions 1312 and 1313, and hence through openings 1314 and 1315 are made as shown in FIG. 24B.

Thereafter, the substrate unit thus obtained is immersed in an aqueous hydrofluoric acid solution to remove the oxide insulating regions 1312 and 1313 through the through openings 1314 and 1315. Then, the porous silicon layers 1102 and 1103 are further selectively etched through the through openings 1314 and 1315. Selective etching is carried out by immersing in an etchant the substrate unit shown in FIG. 24B. As a result, the etchant enters the porous silicon layers 1102 and 1103 from the through holes 1314 and 1315; thus, the epitaxial silicon layers 1104 and 1105 can efficiently be separated from the non-porous silicon layer 1101. The etchant includes typical silicon etchants, porous-silicon etchants such as a hydrofluoric acid solution, a mixture solution of hydrofluoric acid and and an alcohol, a mixture solution of hydrofluoric acid and hydrogen peroxide water, a buffered hydrofluoric acid solution, a mixture solution of buffered hydrofluoric acid and an alcohol, and a mixture solution of buffered hydrofluoric acid and hydrogen peroxide water. The non-porous silicon layer 1101 thus separated can be reused in the subsequent production cycles.

Figure 25A:
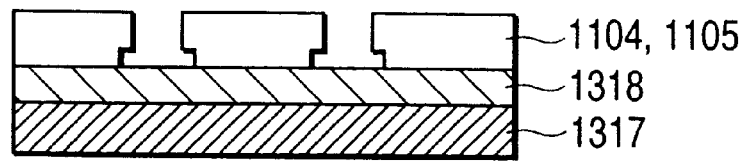
FIGS. 25A, 25B, 25C and 25D are schematic cross-sections showing steps in the process for producing the solar cell in Embodiment 4 of the present invention.
Figure 25B:
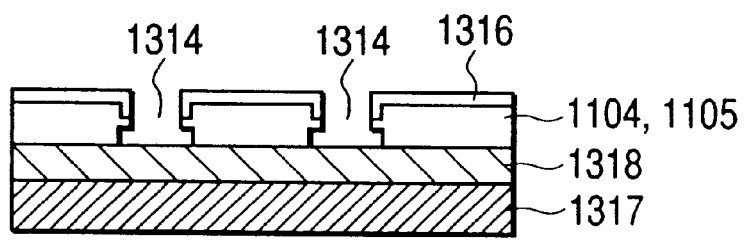
Figure 25C:
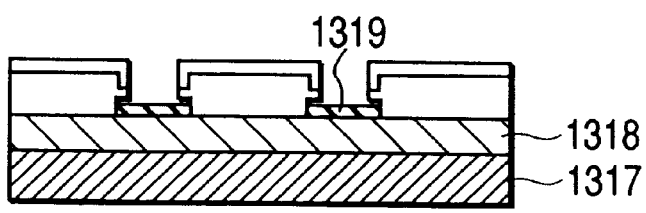
Figure 25D:
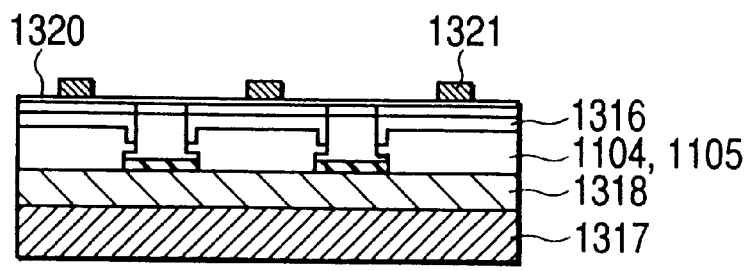

Next, the epitaxial silicon layer 1104 separated is put on a Cr-deposited SUS stainless steel substrate 1317, followed by annealing to form a silicide layer 1318 at the interface between the chromium surface and the epitaxial silicon layer 1104; thus, the epitaxial silicon layer 1104 can be fixed to the SUS stainless steel substrate. A cross-sectional view showing this stage is FIG. 25A. Thereafter, as shown in FIG. 25B, P (phosphorus) is thermally diffused to the surface of the epitaxial silicon layer 1104, using POCl$_3$ as a diffusion source, to form on the surface of the epitaxial silicon layer 1104 an n$^+$-type silicon layer 1316 with a thickness of about 0.5 μm. Thereafter, the dead layer of the n$^+$-type silicon layer 1316 is wet-oxidized and then removed by etching, so that an n$^+$-type silicon layer 1316 of about 0.2 μm having an appropriate surface concentration is formed. In this wet-oxidizing step, the chromium surface standing bare in the through openings 1314 of the epitaxial silicon layer is also oxidized, thus insulating regions 1319 are formed as shown in FIG. 25C. Then, as shown in FIG. 25D, an ITO transparent conductive film 1329 is formed by, e.g., EB (electron beam) deposition, and a collector electrode 1321 is formed thereon using, e.g., chromium.

Embodiment 5

Embodiment 5 of the present invention will be described in detail with reference to the drawings. The present Embodiment 5 is an embodiment for producing a solar cell and is an embodiment in which when described with reference to FIGS. 8A to 8D, silicon oxide is utilized in the separation layers 1002 and 1003 so that the separation layers 1002 and 1003 are selectively etched from both sides through the through openings 1006 and 1007 to separate the thin-film semiconductors 1004 and 1005 from the substrate 1001. In the following, the substrate 1001 is described as a silicon wafer. Alternatively, a compound semiconductor substrate or an SUS stainless steel substrate may be used.

Figure 26A:
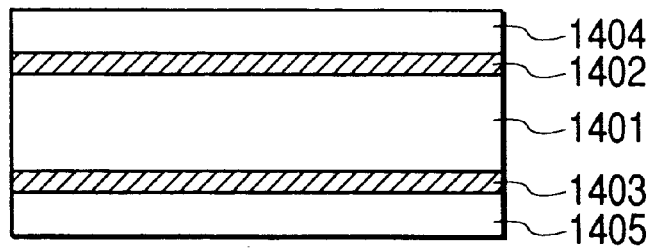
FIGS. 26A, 26B and 26C are schematic cross-sections showing steps in the process for producing a solar cell in Embodiment 5 of the present invention.
Figure 26B:
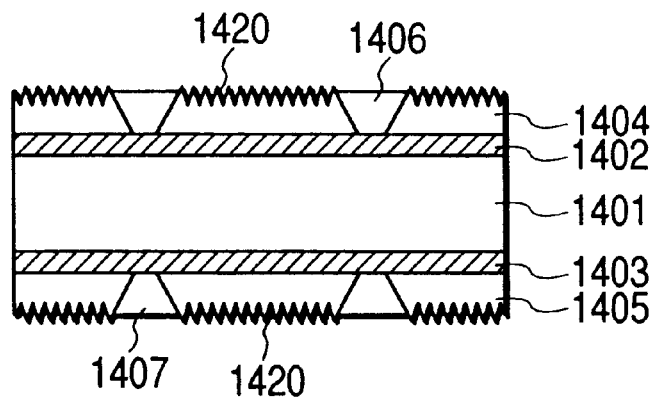
Figure 26C:
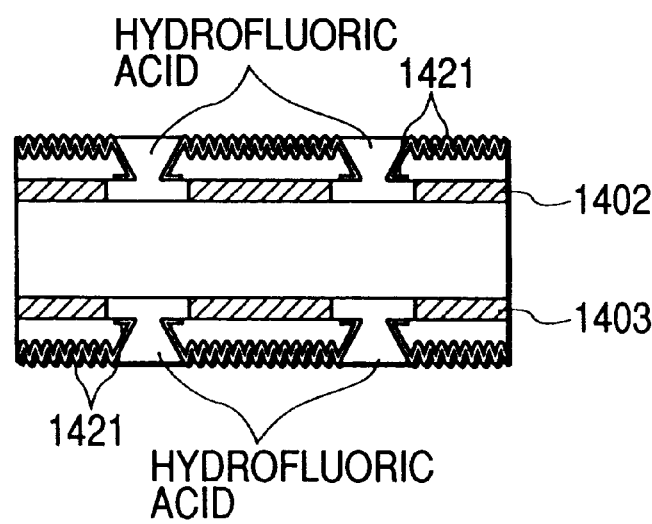

As shown in FIG. 26A, thin-film polycrystalline silicon layers 1404 and 1405 of about 100 μm thick are formed on a substrate 1401 covered with $SiO_2$ layers 1402 and 1403 on both sides. The thin-film polycrystalline silicon layers 1404 and 1405 are formed by, e.g., ZMR (zone melting recrystallization) or thermal CVD. Next, as shown in FIG. 26B, after through holes 1406 and 1407 are selectively provided by etching, textured structures 1420 are formed. Thereafter, as shown in FIG. 26C, these are immersed in hydrofluoric acid to etch away part of the $SiO_2$ layers 1402 and 1403 around the through holes 1406 and 1407, followed by diffusion of phosphorus to form n-type regions 1421 on the surfaces of the layers 1404 and 1405, on the wall surfaces of the through holes 1406 and 1407 and also, through the through holes, on the back sides of the layers 1404 and 1405 around the through holes.

Figure 27A:
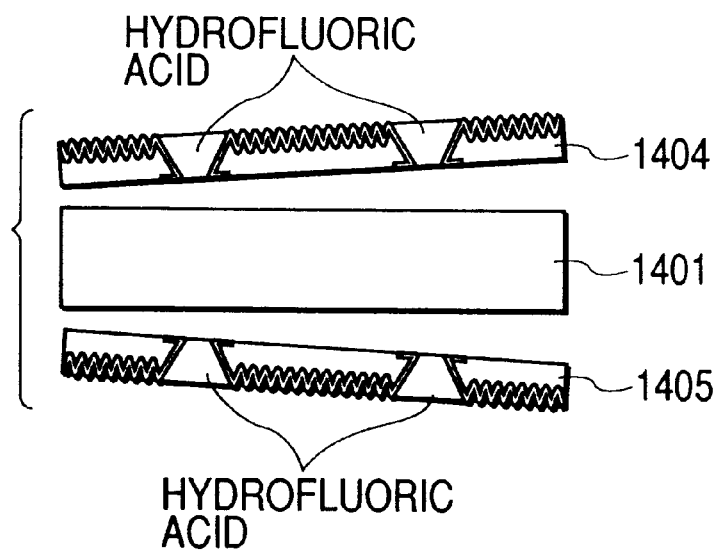
FIGS. 27A, 27B and 27C are schematic cross-sections showing steps in the process for producing the solar cell in Embodiment 5 of the present invention.
Figure 27B:
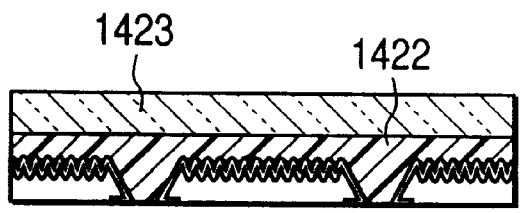
Figure 27C:
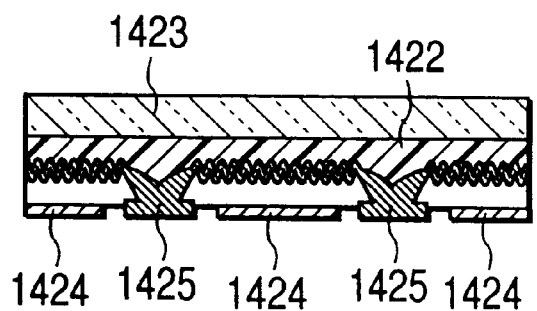

Thereafter, these are again immersed in hydrofluoric acid to etch away the remaining $SiO_2$ layers 1402 and 1403; thus, as shown in FIG. 27A, the thin-film polycrystalline silicon layers 1404 and 1405 are separated from the substrate 1401. The substrate 1401 is returned to the initial step of forming the thin-film polycrystalline silicon layers and reused there. The thin-film polycrystalline silicon layers 1404 and 1405 thus separated are, as shown in FIG. 27B, each attached to glass 1423 by the aid of a transparent resin 1422. Then, a p-type electrode 1424 and an n-type electrode 1425 are formed on the back to complete a solar cell unit cell.

Embodiment 6

Figure 28:
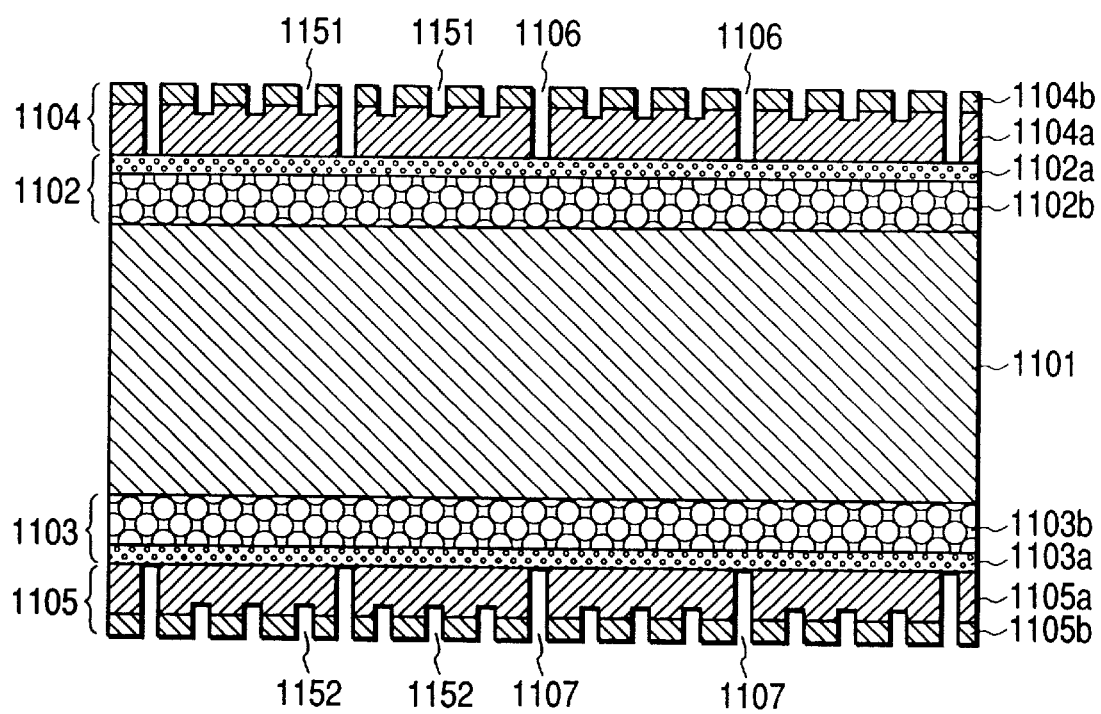
FIG. 28 is a schematic cross-section showing a step in the process for producing an area sensor in Embodiment 6 of the present invention.
Figure 29A:
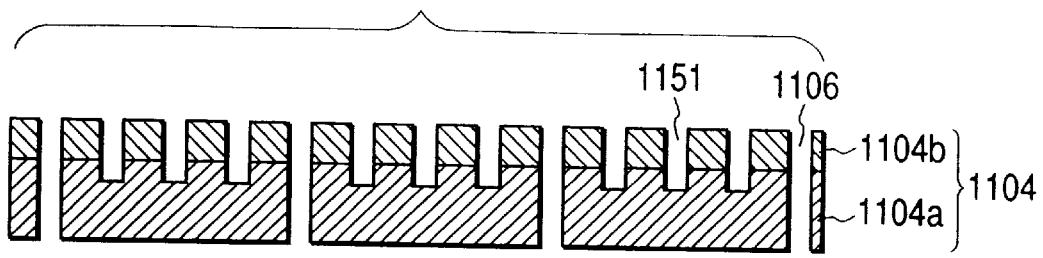
FIGS. 29A, 29B, 29C and 29D are schematic cross-sections showing steps in the process for producing the area sensor in Embodiment 6 of the present invention.

Embodiment 6 of the present invention will be described in detail with reference to the drawings. The present Embodiment 6 is an embodiment for producing a photoelectric transducer such as an area sensor by the present invention. First, according to the same steps as those up to the steps shown in FIGS. 9, 10 and 11 in Embodiment 2, porous silicon layers 1102$b$ and 1103$b$ having a large porosity, porous silicon layers 1102$a$ and 1103$a$ having a small porosity, p$^-$-type silicon layers 1104$a$ and 1105$a$ and n$^+$-type silicon layers 1104$b$ and 1105$b$ are formed on a non-porous silicon layer 1101 on both sides. Thereafter, through holes 1106 and 1107 passing through the p$^-$-type silicon layers 1104$a$ and 1105$a$ and n$^+$-type silicon layers 1104$b$ and 1105$b$ and reaching the porous silicon layers 1102 and 1103 are made at a plurality of spots by means of a laser. In the same steps as these, scribe lines 1151 and 1152 for insulatingly separating the lines of the area sensor are previously made (see FIG. 28). Then, according to the same steps as those described with reference to FIGS. 14 and 15 in Embodiment 2, the porous silicon layers 1102 and 1103 are selectively etched to separate the epitaxial silicon layers 1104 and 1105 from the non-porous silicon layer 1101. As a result, epitaxial silicon layers 1104$a$ and 1104$b$ (1105$a$ and 1105$b$) as cross-sectionally shown in FIG. 29A are obtained.

Figure 29B:
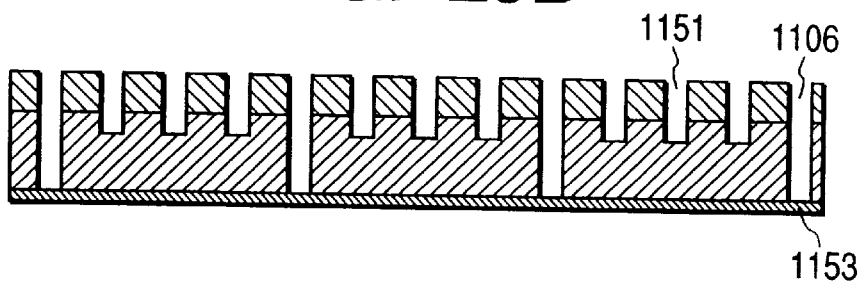
Figure 29C:
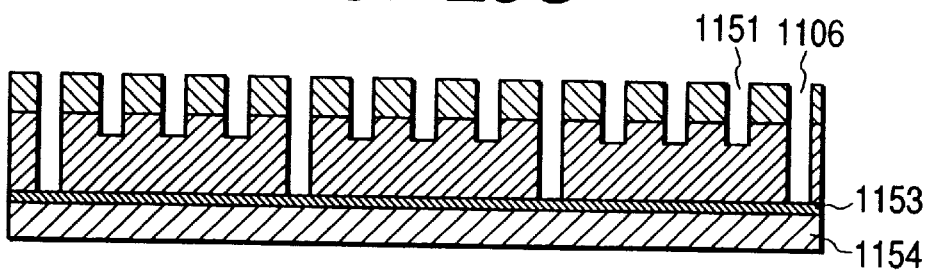
Figure 29D:
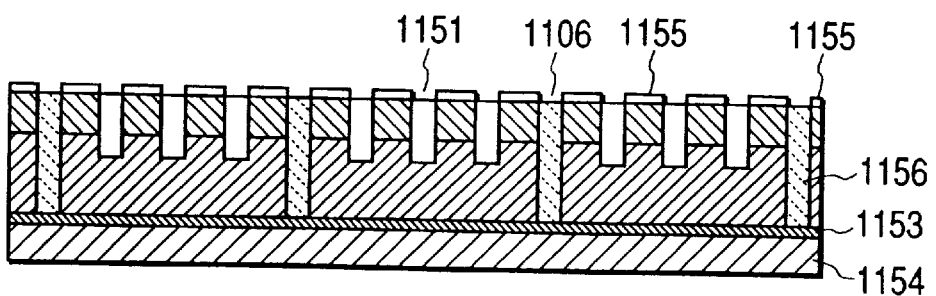

Then, as shown in FIG. 29B, to the back of the epitaxial silicon layer 1104, a back electrode 1153 is attached which extends in stripes in the direction vertical to the scribe lines 1151. Next, as shown in FIG. 29C, these are attached to a supporting substrate 1154. Then, as shown in FIG. 29D, the through holes 1106 and scribe lines 1151 are filled with insulating regions 1156, and thereafter a transparent electrode 1155 of ITO is formed.

Figure 30A:
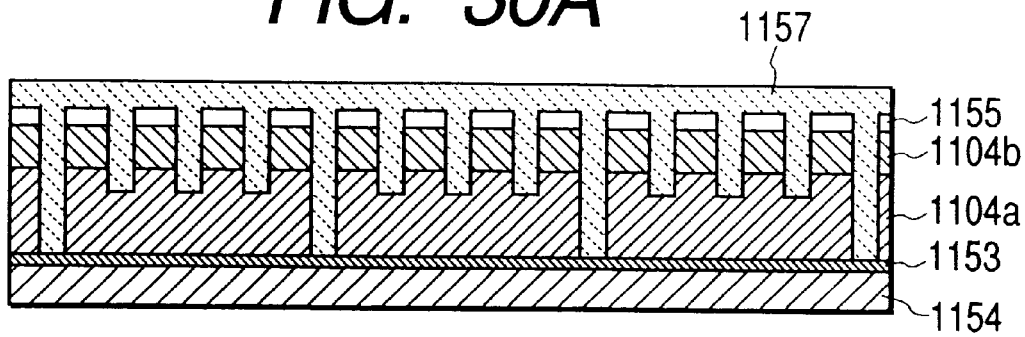
FIGS. 30A, 30B-1 and 30B-2 are a cross-section of the area sensor (FIG. 30A) and plan views thereof (FIGS. 30B-1, 30B-2) in Embodiment 6 of the present invention.
Figures 1, 30B:
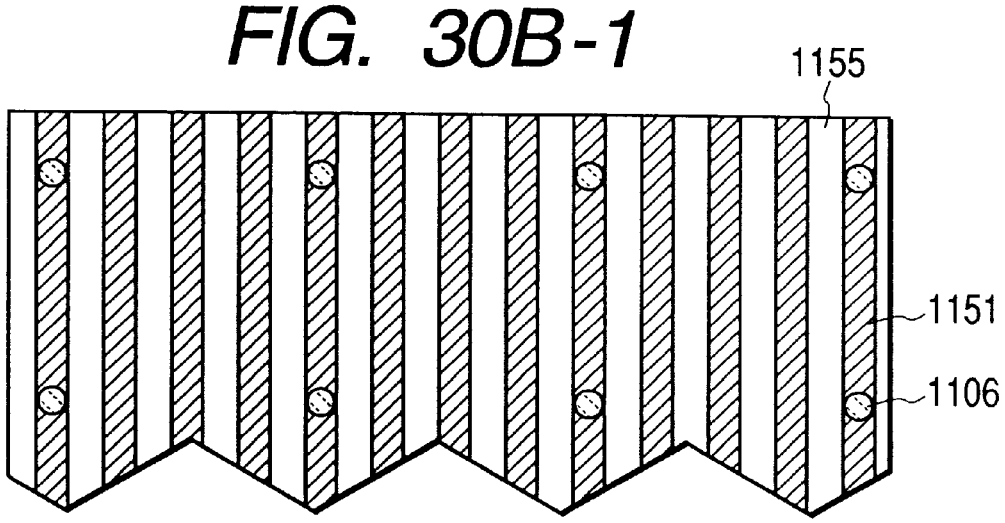
Figures 2, 30B:
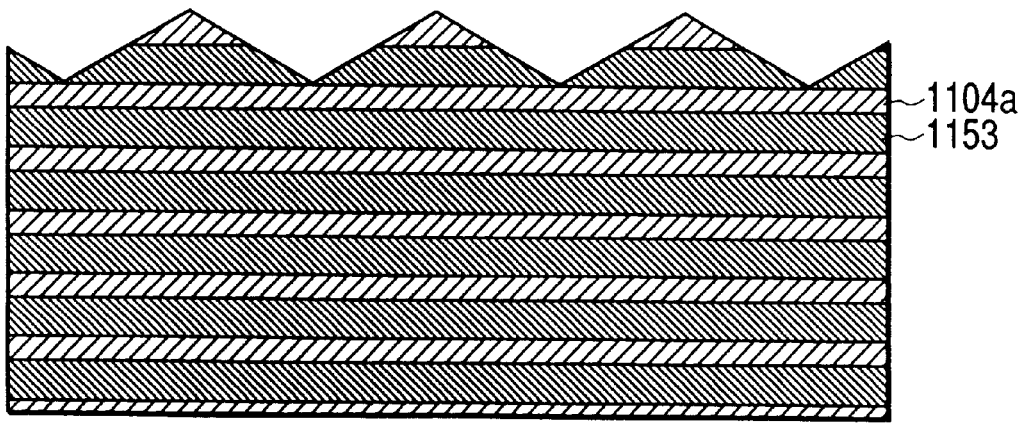
Figure 31A:
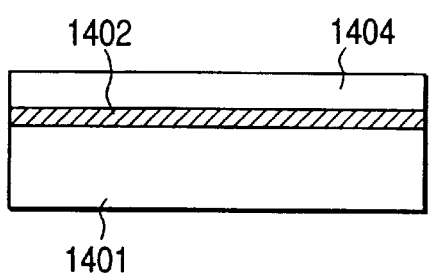
FIGS. 31A, 31B, 31C, 31D, 31E and 31F are schematic cross-sections showing steps in a conventional process for producing a solar cell.
Figure 31B:
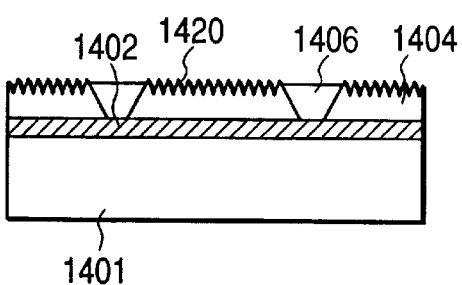
Figure 31C:
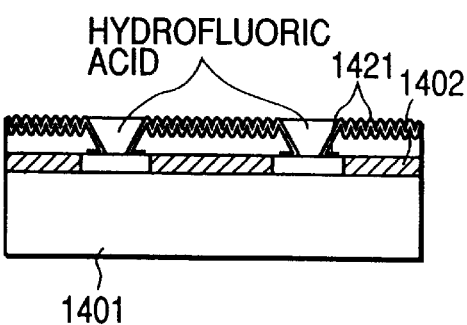
Figure 31D:
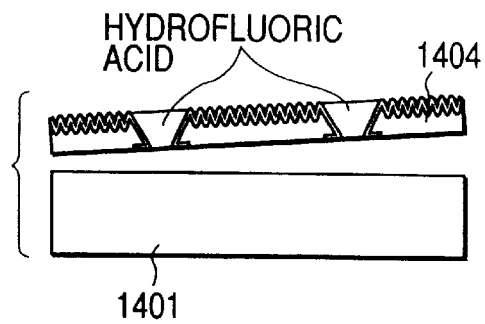
Figure 31E:
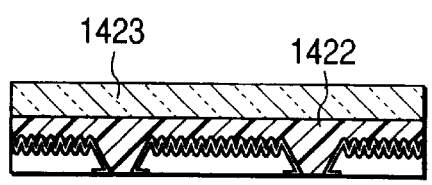
Figure 31F:
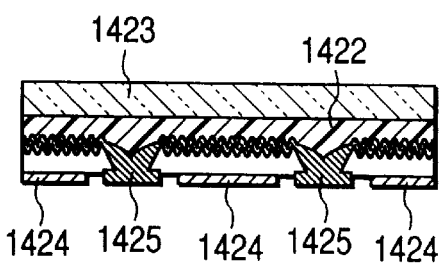
Figure 32:
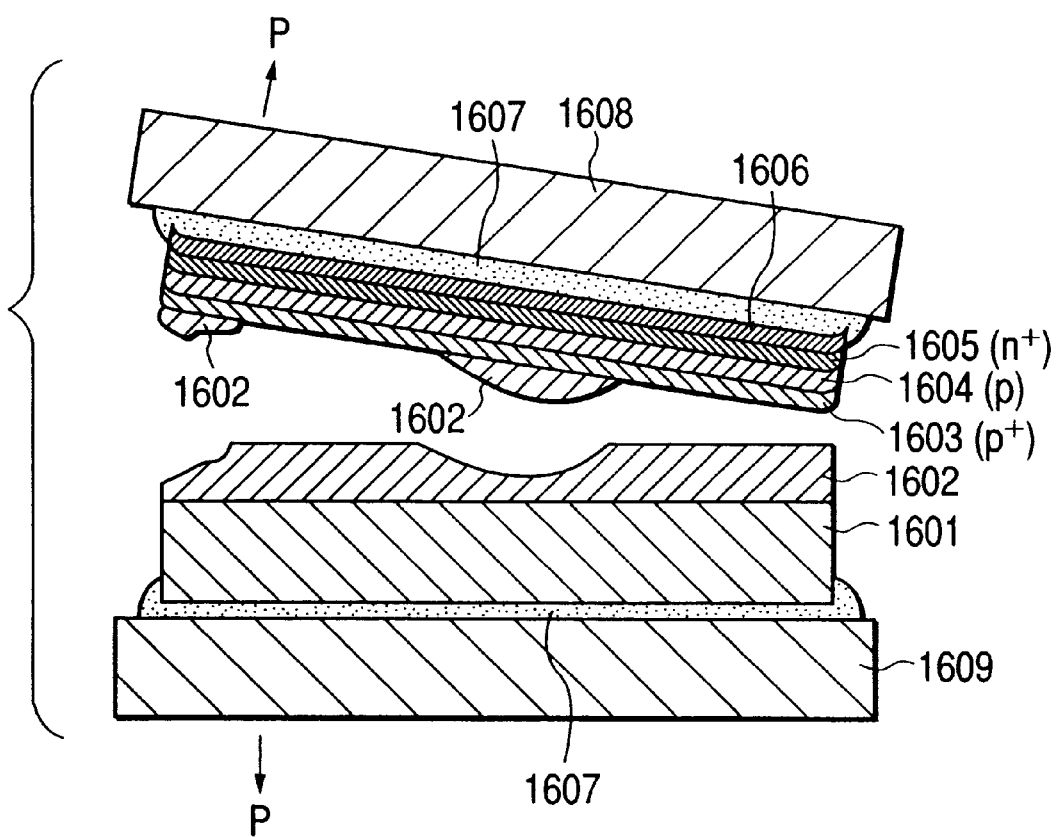
FIG. 32 is a schematic cross-section showing a step in a conventional process for producing a solar cell.

Then, as cross-sectionally shown in FIG. 30A, a reflection preventive film 1157 is attached to the surface; thus, an area sensor is completed. FIG. 30B-1 is a plan view of the area sensor when viewed from the surface, and FIG. 30B-2 is a plan view of the area sensor when viewed from the back. The transparent electrode 1155 on the surface extends in stripes in the longitudinal direction, and the back electrode 1153 extends in stripes in the lateral direction. Also, the area sensor has such a form that the transparent electrode 1155 and back electrode 1153 which form a simple matrix hold between them the p$^-$-type silicon layer 1104$a$ and n$^+$-type silicon layer 1104$b$ which serves as a photodiode.

In the foregoing embodiments, the description centers particularly on processes for producing solar cells. Without limitations to solar cells, the present invention can also be applied to other fields. In particular, the thin-film semiconductor having the function of photoelectric conversion has a high efficiency for its use as materials and can be put into practical use in various technical fields.

In order to form the separation layers according to the above respective embodiments, semiconductor substrates may be subjected to ion implantation to form layers having voids as disclosed in Japanese Patent Application Laid-Open No. 9-331077. More specifically, hydrogen ions are implanted in a semiconductor substrate on both sides to form separation layers having voids, and thin-film semiconductor layers may be separated in the same manner as in the above embodiments.

As examples according to the first principal technique of the present invention, how the desired solar cell is formed will be described below in greater detail. The present invention is by no means limited to these examples.

EXAMPLE 1

The present Example demonstrates how a solar cell is formed by transferring a single-crystal silicon layer to a metal substrate by the process shown in FIGS. 2A to 2H.

First, a 500 μm thick p-type (100) single-crystal silicon wafer 201 (ρ=0.01 Ω·cm) was anodized in a hydrofluoric acid solution under conditions shown in Table 1, to form a porous silicon layer 202 on the wafer (FIG. 2A).

TABLE 1

| | |
|---|---|
| Anodizing solution: | $HF:H_2O:C_2H_5OH = 1:1:1$ |
| Current density: | 5 mA/cm$^2$ |
| Anodizing time: | 2.5 minutes |

Next, on the surface of the porous silicon layer 202, epitaxial growth was carried out under conditions shown in Table 2, using a conventional thermal CVD system, to form a silicon layer (single crystal) 203 in a layer thickness of 30 μm.

TABLE 2

| | |
|---|---|
| Gas flow rate: | $SiH_2Cl_2/H_2$ = 0.5/100 (liters/min) |
| Substrate temp.: | 1,050° C. |
| Pressure: | atmospheric pressure |
| Growth time: | 30 minutes |

Here, in the course of the growth, a trace amount of $B_2H_6$ (1 ppm) was added to make the grown silicon layer into p⁻-type, and also PH₃ was added (300 ppm) in place of B₂H₆ at the end of the growth to form an n⁺-type layer 204 (FIG. 2B). Thus, a p-n junction was formed on the surface of the silicon layer 203.

Next, using XeCl excimer laser beams 205, a plurality of openings 206 of 200 μm diameter were provided on the surface of the silicon layer 203 in lattice dots at intervals of 1 mm. Here, the laser output was so adjusted (e.g., laser energy density: 23.6 J/cm²; oscillation frequency: 100 Hz; continuous irradiation time: about 2.3 seconds) that the bottoms of the openings 206 passed through the silicon layer 203 and reached the porous silicon layer 202 (FIG. 2C).

The wafer thus provided with the silicon layer 203 and the openings 206 was immersed in a mixture solution of hydrofluoric acid, hydrogen peroxide water and deionized water to etch the porous silicon layer 202 selectively to separate the silicon layer 203 (FIG. 2D).

The silicon layer 203 thus separated was put on a Cr(207)-deposited SUS stainless steel substrate 208 and then annealed at 600° C. in an atmosphere of N₂ to form a silicide layer at the interface between the chromium layer and the silicon layer; thus, the silicon layer was fixed onto the SUS stainless steel substrate (FIG. 2E).

Next, in an atmosphere containing oxygen, the openings 206 were again irradiated by XeCl excimer laser beams 209 to oxidize the chromium layer surface standing bare in the openings 206 to form an insulating layer 210 (FIG. 2F). Here, the diameter of the laser beams was made a little larger than the size of the openings 206 at the time of their formation and also the energy thereof was so adjusted that the temperature of silicon at the irradiated portions was sufficiently lower than the melting point; thus, only the silicon at the interiors of the openings 206 and around them was oxidized to make the opening areas insulative.

Finally, a collector electrode 211 (Ti/Pd/Ag: 400 nm/200 nm/1 μm) and an ITO transparent electrode 212 (82 nm) were formed to make a solar cell (FIG. 2G).

On the thin-film single-crystal silicon solar cell thus obtained, its I-V characteristics under irradiation by light of AM 1.5 (100 mW/cm²) were measured to obtain the results that, at a cell area of 6 cm², open-circuit voltage was 0.6 V, short-circuit photoelectric current was 33 mA/cm², fill factor was 0.77, and energy conversion efficiency was 15.2%.

Thus, the epitaxial silicon layer was separable (peelable) from the wafer by a simple process, and a thin-film single-crystal silicon solar cell showing good characteristics was obtained. Also, the porous layer remaining on the silicon wafer after the separation was removed well by etching to make the surface smooth, and thereafter, using the regenerated single-crystal substrate 213 thus obtained (FIG. 2H), the steps described above were repeated. As a result, a plurality of thin-film single-crystal silicon solar cells having semiconductor layers similarly having a high quality were obtained.

EXAMPLE 2

The present example demonstrates how a solar cell is formed by transferring a single-crystal silicon layer to a polyimide film by the process shown in FIGS. 3A to 3H.

First, to the surface of a 500 μm thick p-type (100) single-crystal silicon wafer 301 (a dummy wafer), boron (B) was thermally diffused at a thermal temperature of 1,200° C., using BCl₃ as a thermal diffusion source, to form a p⁺-layer to obtain a diffusion layer 302 of about 3 μm thick. Next, this wafer was anodized in a hydrofluoric acid solution under conditions shown in Table 3 to form a porous silicon layer 302 on the wafer (FIG. 3A).

TABLE 3

| Anodizing solution: | HF:H₂O:C₂H₅OH = 1:1:1 |
|---|---|
| Current density: | 7 mA/cm² |
| Anodizing time: | 2 minutes |

On the surface of the porous silicon layer 302, epitaxial growth was carried out under growth conditions shown in Table 4, using a slider type liquid-phase growth system making use of indium (In) as a solvent to form a silicon layer (single crystal) 303 in a layer thickness of 30 μm.

TABLE 4

| H₂ flow rate: | 5 liters/min. |
|---|---|
| Solvent (In) temp.: | 950° C. → 830° C. |
| Cooling rate: | −1° C./min. |

Here, a trace amount of Ga (1,000 ppm based on the amount of In) was added to make the grown silicon layer into p⁻-type. Also, after the growth was completed, using an additional indium melt containing silicon (Si) and arsenic (As) (As concentration based on the amount of In: 7,000 ppm), an n⁺-type layer 304 of 1 μm thick was further formed on the grown silicon layer (FIG. 3B). Thus, a p-n junction was formed on the surface of the silicon layer 303.

Next, using KrF excimer laser beams 305, a plurality of openings 306 of 180 μm diameter were provided on the surface of the silicon layer 303 in lattice dots at intervals of 1.5 mm. Here, the laser output was so adjusted that the bottoms of the openings 306 passed through the silicon layer 303 and reached the porous silicon layer 302 (FIG. 3C).

The wafer thus provided with the silicon layer 303 and the openings 306 was immersed in a mixture solution of hydrofluoric acid, hydrogen peroxide water and deionized water to etch the porous silicon layer 302 selectively to separate the silicon layer 303 (FIG. 3D).

On one side of a 50 μm thick polyimide film 308, an aluminum paste 307 was coated by screen printing in a thickness of 30 μm, and the silicon layer 303 separated was brought into close contact with and laminated to the surface of this polyimide film 308. In this state, these were put into an oven to bake the aluminum paste at of 360° C. for 20 minutes, and also the polyimide film 308 and the silicon layer 303 were fastened to each other (FIG. 3E).

Next, in an atmosphere containing oxygen, the openings 306 were again irradiated by KrF laser beams 309 to oxidize the aluminum layer surface standing bare in the openings 306 to form an insulating layer 310 (FIG. 3F). Here, the diameter of the laser beams was made a little larger than the size of the openings 306 at the time of their formation and also the energy thereof was so adjusted that the temperature of silicon at the irradiated portions was sufficiently lower than the melting point; thus, only the silicon at the interiors of the openings 306 and around them was oxidized to make the opening areas insulative.

A collector electrode 311 (Ti/Pd/Ag: 400 nm/200 nm/1 μm) and a TiO₂ anti-reflective film 312 (80 nm) were formed to make a solar cell (FIG. 3G).

On the thin-film single-crystal silicon solar cell thus obtained, formed on polyimide, its I-V characteristics under irradiation by light of AM 1.5 (100 mW/cm²) were measured to obtain the results that, at a cell area of 6 cm², open-circuit voltage was 0.59 V, short-circuit photoelectric current was 32 mA/cm², fill factor was 0.76, and energy conversion efficiency was 14.3%.

The porous layer remaining on the silicon wafer after the separation was removed well by etching to make the surface smooth, and thereafter, using the regenerated single-crystal substrate 313 thus obtained (FIG. 3H), the steps described above were repeated. As a result, a plurality of thin-film single-crystal silicon solar cells having semiconductor layers similarly having a high quality were obtained.

EXAMPLE 3

The present example demonstrates how a solar cell is formed by transferring a single-crystal silicon layer to a glass substrate by the process shown in FIGS. 4A to 4I.

First, a 500 μm thick p-type (100) single-crystal silicon wafer 401 (ρ=0.01 Ω·cm) was anodized in a hydrofluoric acid solution under conditions shown in Table 1 to form a porous silicon layer 402 on the wafer (FIG. 4A).

Next, on the surface of the porous silicon layer 402, epitaxial growth was carried out under conditions shown in Table 2, using a conventional thermal CVD system, to form a silicon layer (single crystal) 403 in a layer thickness of 30 μm. Here, in the course of the growth, a trace amount of $B_2H_6$ (0.5 ppm) was added to make the grown silicon layer into p⁻-type (FIG. 4B).

Next, using XeCl excimer laser beams 404, a plurality of openings 405 of 80 μm diameter were provided on the surface of the silicon layer 403 in lattice dots at intervals of 1.75 mm. Here, the laser output was so adjusted that the bottoms of the openings 405 passed through the silicon layer 403 and reached the porous silicon layer 402 (FIG. 4C).

The wafer thus provided with the silicon layer 403 and the openings 405 was immersed in a mixture solution of hydrofluoric acid, hydrogen peroxide water and deionized water to etch the porous silicon layer 402 partly around the openings 405 (FIG. 4D). Thereafter, P (phosphorus) was thermally diffused at 900° C. using $POCl_3$ as a diffusion source to form n⁺-type layer regions 406 on the surfaces of the silicon layer 403, on the wall surfaces of the openings 405 and also, through the openings 405, on the back sides of the silicon layer 403 around the openings (FIG. 4E). Thus, a p-n junction was formed on the surface of the silicon layer 403.

Thereafter, this wafer unit was/again immersed in a mixture solution of hydrofluoric acid, hydrogen peroxide water and deionized water to etch the remaining porous silicon layer 402 to separate the silicon layer 403 from the wafer 401 (FIG. 4F).

The surface side (n⁺-type layer) of the silicon layer 403 thus separated and a glass substrate 408 were laminated to each other via a transparent resin 407 such as EVA (ethylene vinyl acetate) (FIG. 4G). Thereafter, a p-electrode 409 and an n-electrode 410 were formed on the back (FIG. 4H). In this case, the solar cell can be free from loss due to shadow because all the electrodes are formed on the back, and the collector electrode is not formed on the light-incident side.

On the thin-film single-crystal silicon solar cell thus obtained, its I-V characteristics under irradiation by light of AM 1.5 (100 mW/cm²) were measured to obtain the results that, at a cell area of 6 cm², open-circuit voltage was 0.6 V, short-circuit photoelectric current was 33.3 mA/cm², fill factor was 0.79, and energy conversion efficiency was 15.8%.

The porous layer remaining on the silicon wafer after the separation was removed well by etching to make the surface smooth, and thereafter, using the regenerated single-crystal substrate 413 thus obtained (FIG. 4I), the steps described above were repeated. As a result, a plurality of thin-film single-crystal silicon solar cells having semiconductor layers similarly having a high quality were obtained.

EXAMPLE 4

The present example demonstrates how a through-hole contact type solar cell is formed by transferring a single-crystal silicon layer to a metal substrate by the process shown in FIGS. 5A to 5H.

First, to the surface of a 500 μm thick p-type (100) single-crystal silicon wafer 501 (a dummy wafer), boron (B) was thermally diffused at a thermal temperature of 1,150° C., using $BCl_3$ as a thermal diffusion source, to form a p⁺-layer to obtain a diffusion layer of about 2.5 μm thick. Next, this wafer was anodized in a hydrofluoric acid solution under conditions shown in Table 5 to form a porous silicon layer 502 on the wafer (FIG. 5A).

TABLE 5

| | |
|---|---|
| Anodizing solution: | $HF:H_2O:C_2H_5OH$ = 10:10:1 |
| Current density: | 8 mA/cm² |
| Anodizing time: | 1 minute |

On the surface of the porous silicon layer 502, epitaxial growth was carried out under growth conditions shown in Table 6, using a slider type liquid-phase growth system making use of indium (In) as a solvent to form a silicon layer (single crystal) 503 in a layer thickness of 35 μm.

TABLE 6

| | |
|---|---|
| $H_2$ flow rate: | 4 liters/min. |
| Solvent (In) temp.: | 950° C. → 810° C. |
| Cooling rate: | −1.7° C./min. |

Here, a trace amount of Ga (800 ppm based on the amount of In) was added to make the grown silicon layer into p⁻-type. Also, after the growth was completed, using an additional indium melt containing silicon (Si) and arsenic (As) (As concentration based on the amount of In: 10,000 ppm), an n⁺-type layer 504 0.5 μm thick was further formed on the grown silicon layer (FIG. 5B). Thus, a p-n junction was formed on the surface of the silicon layer 503.

Next, using YAG laser beams 505, a plurality of openings 506 of 130 μm diameter were provided on the surface of the silicon layer 503 in lattice dots at intervals of 2 mm. Here, the laser output was so adjusted that the bottoms of the openings 506 passed through the silicon layer 503 and reached the porous silicon layer 502 (FIG. 5C).

The wafer thus provided with the silicon layer 503 and the openings 506 was immersed in a mixture solution of hydrofluoric acid, hydrogen peroxide water and deionized water to etch the porous silicon layer 502 selectively to separate the silicon layer 503 (FIG. 5D).

The silicon layer 503 thus separated was put on an SUS stainless steel substrate 509 provided superposingly thereon an insulating layer 507 and an aluminum sheet 508, and then heated to fasten the silicon layer 503 to the aluminum sheet 508 (FIG. 5E).

Thereafter, the silicon layer 503, the aluminum sheet 508 beneath the silicon layer 503 and the insulating layer 507 were etched while irradiating the silicon layer 503 by laser beams 510 using an XeCl excimer laser, at its position provided with the openings 506, the laser beams having a diameter a little larger than the size of the openings 506, thereby widening the openings 506 a little. At the time the surface of the SUS stainless steel substrate 509 became bare, the irradiation by laser beams was stopped (FIG. 5F).

Here, since the silicon layer 503 and aluminum sheet 508 are subjected to laser etching in an atmosphere containing oxygen, the wall surfaces in the openings 506 of the silicon layer 503 and the edge faces of the aluminum sheet 508 are covered with oxide films after the etching, so that they are insulated (not shown).

Next, a conductive material (such as copper paste) 511 was applied inside the openings 506 and around the top areas of the openings 506 by screen printing, followed by baking, and finally an anti-reflective film 512 (SiO: 82 nm) was formed on the surface of the silicon layer 503 by EB vacuum deposition. Thus, a through-hole contact type solar cell was produced (FIG. 5G).

On the thin-film single-crystal silicon solar cell thus obtained, its I-V characteristics under irradiation by light of AM 1.5 (100 mW/cm$^2$) were measured to obtain the results that, at a cell area of 6 cm$^2$, open-circuit voltage was 0.58 V, short-circuit photoelectric current was 32.7 mA/cm$^2$, fill factor was 0.78, and energy conversion efficiency was 14.8%.

The porous layer remaining on the silicon wafer after the separation was removed well by etching to make the surface smooth, and thereafter, using the regenerated single-crystal substrate 513 thus obtained (FIG. 5H), the steps described above were repeated. As a result, a plurality of thin-film single-crystal silicon solar cells having semiconductor layers similarly having a high quality were obtained.

EXAMPLE 5

The present example demonstrates how a solar cell is formed by transferring a compound semiconductor layer to a polyimide film by the process shown in FIGS. 6A to 6H.

First, to the surface of a 500 μm thick single-crystal silicon wafer 601, boron (B) was thermally diffused at a thermal temperature of 1,200° C., using BCl$_3$ as a thermal diffusion source, to form a p$^+$-layer to obtain a diffusion layer of about 3 μm thick. Next, this wafer was anodized in a hydrofluoric acid solution under conditions shown in Table 1 to form a porous silicon layer 602 on the wafer (FIG. 6A).

The surface of the porous silicon layer 602 was annealed at 1,050° C. for 7 minutes in an atmosphere of hydrogen, and thereafter a GaAs/AlGaAs layer (single crystal) 603 was deposited thereon by means of an MOCVD (metalorganic chemical vapor deposition) system (FIG. 6B).

Figure 7:
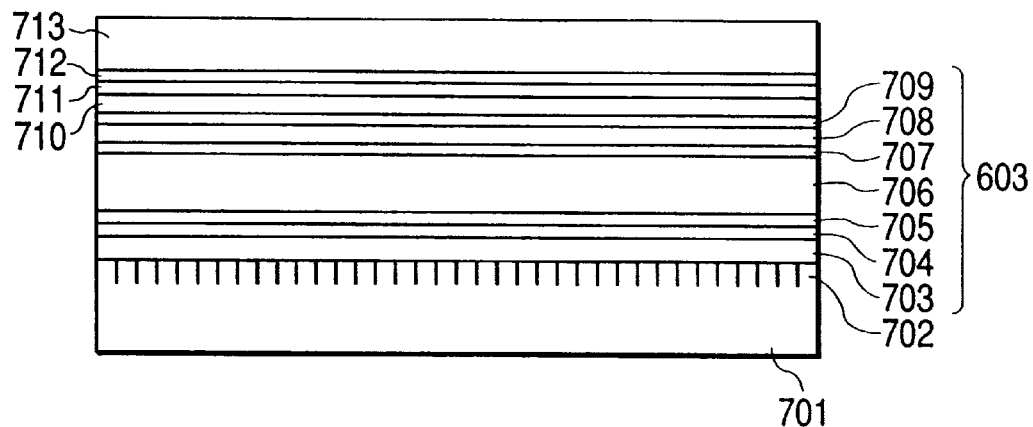
FIG. 7 is a schematic cross-section showing the structure of a thin-film GaAs/AlGaAs solar cell formed on a porous layer by the solar cell production process shown in FIGS. 6A to 6G.

FIG. 7 illustrates in detail the structure shown in FIG. 6B. A porous silicon layer 702 is formed on the single-crystal silicon wafer 701, and subsequently, as the GaAs/AlGaAs layer (single crystal) 603 it was formed by successively depositing layers 703 comprised of n$^+$-GaAs; 704, n$^+$-Al$_x$Ga$_{1-x}$As; 705, n-Al$_{0.37}$Ga$_{0.63}$As; 706, p-Al$_{0.37}$Ga$_{0.63}$As; 707, p$^+$-Al$_x$Ga$_{1-x}$As; 708, p-Al$_{0.37}$Ga$_{0.63}$As; 709, n$^+$-Al$_x$Ga$_{1-x}$As; 710, n-Al$_{0.37}$Ga$_{0.63}$As; 711, n$^-$-Al$_{0.9}$Ga$_{0.1}$As; 712, n-GaAs; and 713, p-GaAs.

Next, using XeCl excimer laser beams 604, a plurality of openings 605 of 100 μm diameter were provided on the surface of the GaAs/AlGaAs layer 603 in lattice dots at intervals of 1 mm. Here, the laser output was so adjusted that the bottoms of the openings 605 passed through the GaAs/AlGaAs layer 603 and reached the porous silicon layer 602 (FIG. 6C).

The wafer thus provided with the GaAs/AlGaAs layer 603 and the openings 605 was immersed in a mixture solution of ethylenediamine, pyrocatechol and deionized water to etch the porous silicon layer 602 selectively. The GaAs/AlGaAs layer 603 remained without being etched, and only the porous silicon layer 602 was removed (FIG. 6D).

Next, Pd/Au was formed on the surface layer p-GaAs layer of the GaAs/AlGaAs layer 603 by EB vacuum deposition. Thereafter, on one side of a 50 μm thick polyimide film 606, a copper paste was coated by screen printing in a thickness of 30 μm, and the GaAs/AlGaAs layer 603 separated was brought into close contact with the surface of this polyimide film 606. These were put into an oven to bake the copper paste at 370° C. for 20 minutes, and also the polyimide film 606 and the GaAs/AlGaAs layer 603 were fastened to each other (FIG. 6E).

The n$^+$-GaAs layer forming the light-incident surface of the GaAs/AlGaAs layer 603 on the polyimide film 606 was etched in a grid pattern to lay the n$^+$-Al$_x$Ga$_{1-x}$As layer bare, and a surface electrode (Au/Ge/Ni/Au) 608 was formed only on the grid-like n$^+$-GaAs layer by EB vacuum deposition and photolithography. Thereafter, as an anti-reflective film 609, TiO$_2$/MgO was deposited by plasma-assisted CVD. Thus, a solar cell was produced (FIG. 6F).

On the thin-film single-crystal GaAs/AlGaAs solar cell thus obtained, formed on the polyimide film 606, its I-V characteristics under irradiation by light of AM 1.5 (100 mW/cm$^2$) were measured to obtain the results that, at a cell area of 4 cm$^2$, open-circuit voltage was 2.1 V, short-circuit photoelectric current was 13.1 mA/cm$^2$, fill factor was 0.80, and energy conversion efficiency was 22.0%.

The porous layer 602 remaining on the silicon wafer 601 after the separation was removed well by etching in the same manner as in other examples to make the surface smooth, and thereafter, using the regenerated single-crystal substrate 601 thus obtained (FIG. 6G), the steps described above were repeated. As a result, a plurality of thin-film compound semiconductor solar cells having higher quality semiconductor layers were obtained.

In the above, the first principal technique of the present invention has been described specifically by giving examples. The present invention is by no means limited to the above examples, and various modifications are possible. For example, in each of the above examples, the porous layer is formed on one side of the substrate, but the porous layer can readily be formed also on the other side by reversing the direction of the flow of electric currents at the time of anodizing after the porous layer has been formed on one side of the substrate. Accordingly, the steps subsequent thereto may be carried out on both sides of the substrate, whereby examples of the second principal technique of the present invention can be given, making it possible to obtain twice as many thin-film crystal solar cells at one time. This enables further improvement in mass productivity.

As having been described above, the present invention has made it possible to obtain good-characteristic thin-film crystal solar cells in good efficiency on low-cost substrates such as metal substrates, and this has made it possible to provide mass-productive good-quality solar cells in the market.

The present invention also has made it possible to utilize materials effectively while forming good-characteristic thin-film crystal solar cells by separating them from a substrate and by using the substrate while regenerating it, so that inexpensive solar cells can be produced.

The present invention still also makes it possible to obtain two thin-film semiconductors on both sides of a substrate, and hence, because of a very high production efficiency, contributes to the manufacture of solar cells and photoelectric transducers at a lower cost.

What is claimed is:

1. A process for producing a solar cell making use of an epitaxial film grown on a silicon wafer, the process comprising the steps of:
   i) forming a porous layer on one-side surface of the silicon wafer by anodizing;
   ii) growing at least one semiconductor layer on the porous layer by epitaxial growth;
   iii) forming a semiconductor junction on the surface of the semiconductor layer;
   iv) providing openings in the semiconductor layer, each of the openings extending from the surface of the semiconductor layer and reaching the porous layer; and
   v) removing the porous layer by etching through the openings to separate the semiconductor layer from the silicon wafer.

2. The process for producing a solar cell according to claim 1, wherein the openings are formed by applying laser beams.

3. The process for producing a solar cell according to claim 1, wherein the openings are made insulative at their interiors and around them.

4. The process for producing a solar cell according to claim 1, wherein the epitaxial growth is liquid-phase growth.

5. The process for producing a solar cell according to claim 1, wherein the semiconductor junction is formed by introducing an impurity.

6. The process for producing a solar cell according to claim 5, wherein the impurity is introduced after the semiconductor layer has been grown.

7. The process for producing a solar cell according to claim 6, wherein after the growth of the semiconductor layer, the impurity is similarly introduced into a second semiconductor layer formed by epitaxial growth.

8. The process for producing a solar cell according to claim 5, wherein the impurity is introduced by ion implantation or thermal diffusion.

9. The process for producing a solar cell according to claim 7, wherein the impurity is introduced while growing the semiconductor layer or the second semiconductor layer.

10. The process for producing a solar cell according to claim 1, wherein the porous layer comprises silicon.

11. The process for producing a solar cell according to claim 1, wherein the semiconductor layer comprises silicon.

12. The process for producing a solar cell according to claim 1, wherein the semiconductor layer comprises compound semiconductors.

13. A process for producing a solar cell making use of an epitaxial film grown on a silicon wafer, the process comprising the steps of:
   i) forming porous layers on each of both-side surfaces of the silicon wafer by anodizing;
   ii) growing semiconductor layers respectively on the both porous layers by epitaxial growth;
   iii) forming semiconductor junctions on each surface of the both semiconductor layers;
   iv) providing openings in the both semiconductor layers, each of the openings extending from the surface of the semiconductor layers and reaching the porous layers; and
   v) removing the porous layers by etching through the openings to separate the semiconductor layers from the silicon wafer.

14. The process for producing a solar cell according to claim 13, wherein the openings are formed by applying laser beams.

15. The process for producing a solar cell according to claim 13, wherein the openings are made insulative at their interiors and around them.

16. The process for producing a solar cell according to claim 13, wherein the both semiconductor layers are simultaneously formed by the epitaxial growth.

17. The process for producing a solar cell according to claim 13, wherein the epitaxial growth is liquid-phase growth.

18. The process for producing a solar cell according to claim 13, wherein the semiconductor junction is formed by introducing an impurity.

19. The process for producing a solar cell according to claim 18, wherein the impurity is introduced after the semiconductor layers have been grown.

20. The process for producing a solar cell according to claim 18, wherein after the growth of the semiconductor layers, the impurity is similarly introduced into second semiconductor layers formed by epitaxial growth.

21. The process for producing a solar cell according to claim 18, wherein the impurity is introduced by ion implantation or thermal diffusion.

22. The process for producing a solar cell according to claim 20, wherein the impurity is introduced while growing the semiconductor layers or the second semiconductor layers.

23. The process for producing a solar cell according to claim 13, wherein the porous layers comprise silicon.

24. The process for producing a solar cell according to claim 13, wherein the semiconductor layers comprise silicon.

25. The process for producing a solar cell according to claim 13, wherein the semiconductor layers comprise compound semiconductors.

26. A process for producing a thin-film semiconductor making use of an epitaxial film grown on a silicon wafer, the process comprising the steps of:
   i) forming a porous layer on one-side surface of the silicon wafer by anodizing;
   ii) growing at least one semiconductor layer on the porous layer by epitaxial growth;
   iii) forming a semiconductor junction on the surface of the semiconductor layer;
   iv) providing openings in the semiconductor layer, each of the openings extending from the surface of the semiconductor layer and reaching the porous layer; and
   v) removing the porous layer by etching through the openings to separate the semiconductor layer from the silicon wafer.

27. A process for producing a thin-film semiconductor making use of an epitaxial film grown on a silicon wafer, the process comprising the steps of:
   i) forming porous layers on each of both-side surfaces of the silicon wafer by anodizing;
   ii) growing semiconductor layers respectively on the both porous layers by epitaxial growth;
   iii) forming semiconductor junctions on each surface of the both semiconductor layers;
   iv) providing openings in the both semiconductor layers, each of the openings extending from the surface of the semiconductor layer and reaching the porous layers; and
   v) removing the porous layers by etching through the openings to separate the semiconductor layers from the silicon wafer.

28. A process for separating a thin-film semiconductor, which comprises forming a separation layer on a substrate, forming at least one thin-film semiconductor on the separation layer, forming in the thin-film semiconductor through openings which reach the separation layer, and separating the thin-film semiconductor from the substrate at the separation layer, wherein the separation layer is formed in pair on the both sides of the substrate, the thin-film semiconductor is formed in pair on the both separation layers, the through openings are formed in the both thin-film semiconductors so as to reach the both separation layers, and the both thin-film semiconductors are separated from the substrate at the both separation layers.

29. The process for separating a thin-film semiconductor according to claim 28, wherein an etchant is made to enter through the through openings to selectively etch the both separation layers.

30. The process for separating a thin-film semiconductor according to claim 28, wherein the separation layers are porous silicon layers, and the thin-film semiconductors are single-crystal silicon layers formed on the porous silicon layers by epitaxial growth.

31. The process for separating a thin-film semiconductor according to claim 30, wherein, at the time of the epitaxial growth, the substrate is supported at four points and the front and back surfaces of the substrate is kept open.

32. The process for separating a thin-film semiconductor according to claim 28, wherein the thin-film semiconductors are electric power-generating layers of solar cells, and the through openings function as through holes.

33. A process for forming a semiconductor, which comprises forming a porous silicon layer on a substrate, forming at least one thin-film semiconductor on the porous silicon layer, forming in the thin-film semiconductor through openings which reach the porous silicon layer, and separating the thin-film semiconductor from the substrate at the porous silicon layer to form the semiconductor, wherein the porous silicon layer is formed in pair on the both sides of the substrate, the thin-film semiconductor is formed in pair on the both-side porous silicon layers, the through openings are formed in the both-side thin-film semiconductors so as to extend from the surface of the both-side thin-film semiconductors and reach the both-side porous silicon layers, a p-n junction is formed on the both-side thin-film semiconductors, the both-side thin-film semiconductors are separated from the substrate at the both-side porous silicon layers, and electrodes are formed on each of the surfaces of p-n junctions.

34. The process for forming a semiconductor according to claim 33 wherein an etchant is made to enter through the through openings to etch the both-side porous silicon layers selectively.

* * * * *

UNITED STATES PATENT AND TRADEMARK OFFICE
CERTIFICATE OF CORRECTION

PATENT NO.    : 6,331,208 B1
DATED         : December 18, 2001
INVENTOR(S)   : Shoji Nishida et al.

It is certified that error appears in the above-identified patent and that said Letters Patent is hereby corrected as shown below:

Title page,
Item [57], ABSTRACT,
Line 23, -- Then, the base conductive substrate is connected with the contact electrode. Thus, solar cells having good characteristics are produced at a low cost. -- should be added.

Column 27,
Line 58, "$n^-\text{-}Al_{0.9}Ga_{0.1}As;$" should read -- $n^+\text{-}Al_{0.9}Ga_{0.1}As;$ --.

Signed and Sealed this

Thirty-first Day of December, 2002

JAMES E. ROGAN
*Director of the United States Patent and Trademark Office*